US012575247B2

(12) United States Patent
Xu

(10) Patent No.: US 12,575,247 B2
(45) Date of Patent: Mar. 10, 2026

(54) TRANSISTOR AND METHOD FOR FABRICATING THE SAME

(71) Applicant: BEIJING HUA TAN YUAN XIN ELECTRONICS TECHNOLOGY CO., LTD., Beijing (CN)

(72) Inventor: Haitao Xu, Beijing (CN)

(73) Assignee: BEIJING HUA TAN YUAN XIN ELECTRONICS TECHNOLOGY CO., LTD. (CN)

( * ) Notice: Subject to any disclaimer, the term of this patent is extended or adjusted under 35 U.S.C. 154(b) by 635 days.

(21) Appl. No.: 18/043,726

(22) PCT Filed: Aug. 18, 2020

(86) PCT No.: PCT/CN2020/109815
§ 371 (c)(1),
(2) Date: Mar. 1, 2023

(87) PCT Pub. No.: WO2021/227290
PCT Pub. Date: Nov. 18, 2021

(65) Prior Publication Data
US 2023/0361175 A1 Nov. 9, 2023

(30) Foreign Application Priority Data

May 11, 2020 (CN) .......................... 202010393412.1

(51) Int. Cl.
*H10K 10/82* (2023.01)
*H01L 21/02* (2006.01)
(Continued)

(52) U.S. Cl.
CPC ....... *H10K 10/82* (2023.02); *H01L 21/02301* (2013.01); *H01L 21/30604* (2013.01);
(Continued)

(58) Field of Classification Search
CPC .... H10D 30/014; H10D 30/019; H10D 30/43; H10D 30/47; H10D 30/481;
(Continued)

(56) References Cited

U.S. PATENT DOCUMENTS

| | | | |
|---|---|---|---|
| 10,355,102 B2 | 7/2019 | Cheng et al. | |
| 10,559,688 B2 | 2/2020 | Lee et al. | |

(Continued)

FOREIGN PATENT DOCUMENTS

| | | | | |
|---|---|---|---|---|
| CN | 103258741 A | | 8/2013 | |
| CN | 104465524 B | * | 4/2018 | ........... H10D 64/035 |

(Continued)

OTHER PUBLICATIONS

Sharma et al, "Study and manipulation of charges present in silicon nitride films," 2013 IEEE 39th Photovoltaic Specialists Conference (PVSC), Tampa, FL, USA, 2013, pp. 1288-1293, doi: 10.1109/PVSC.2013.6744377. (Year: 2013).*
(Continued)

*Primary Examiner* — Joseph C. Nicely
(74) *Attorney, Agent, or Firm* — Emerson, Thomson & Bennett, LLC; Roger D. Emerson; Peter R. Detorre

(57) ABSTRACT

A transistor and a method for fabricating the transistor are provided. The semiconductor structure transistor includes a base, a low-dimensional material layer, a plurality of spacers, a source, a drain, and a gate stack. The low-dimensional material layer is provided above the base. The plurality of spacers is provided on a surface of the low-dimensional material layer away from the base and spaced apart from each other. The source and the drain are provided on the surface of the low-dimensional material layer away from the base, respectively. The gate stack is provided on the surface of the low-dimensional material layer away from the base and between the source and the drain, in which the gate
(Continued)

stack, the source and the drain are separated by the spacers, and in contact with the spacers, respectively. Therefore, the transistor has advantages of excellent comprehensive performance, high process compatibility, and good device uniformity.

9 Claims, 14 Drawing Sheets

(51) Int. Cl.

| | |
|---|---|
| *H01L 21/306* | (2006.01) |
| *H10D 30/00* | (2025.01) |
| *H10D 30/01* | (2025.01) |
| *H10D 30/43* | (2025.01) |
| *H10D 30/47* | (2025.01) |
| *H10D 30/62* | (2025.01) |
| *H10D 62/10* | (2025.01) |
| *H10D 64/01* | (2025.01) |
| *H10D 64/27* | (2025.01) |
| *H10D 64/66* | (2025.01) |
| *H10K 10/84* | (2023.01) |
| *H10D 64/23* | (2025.01) |
| *H10K 85/20* | (2023.01) |

(52) U.S. Cl.

CPC ......... *H10D 30/014* (2025.01); *H10D 30/019* (2025.01); *H10D 30/0191* (2025.01); *H10D 30/0195* (2025.01); *H10D 30/0198* (2025.01); *H10D 30/43* (2025.01); *H10D 30/47* (2025.01); *H10D 30/481* (2025.01); *H10D 30/501* (2025.01); *H10D 30/502* (2025.01); *H10D 30/507* (2025.01); *H10D 30/6219* (2025.01); *H10D 62/118* (2025.01); *H10D 62/119* (2025.01); *H10D 62/121* (2025.01); *H10D 64/021* (2025.01); *H10D 64/512* (2025.01); *H10D 64/675* (2025.01); *H10K 10/84* (2023.02); *H10D 64/251* (2025.01); *H10K 85/221* (2023.02)

(58) Field of Classification Search

CPC ............. H10D 30/0191; H10D 30/501; H10D 30/502; H10D 30/0195; H10D 30/507; H10D 30/0198; H10D 30/6219; H10D 62/118; H10D 62/119; H10D 62/121; H10D 64/251; H10K 85/221; H10K 10/84

See application file for complete search history.

(56) References Cited

U.S. PATENT DOCUMENTS

| | | | |
|---|---|---|---|
| 10,784,360 B2 | 9/2020 | Sung et al. | |
| 12,324,195 B2 * | 6/2025 | Lee ...................... | H10D 64/017 |
| 2017/0229497 A1 * | 8/2017 | Han ...................... | H10F 39/026 |
| 2019/0148515 A1 * | 5/2019 | Cheng ................. | H10D 64/018 |
| | | | 257/347 |
| 2019/0273144 A1 | 9/2019 | Leobandung | |
| 2023/0080922 A1 * | 3/2023 | Yao ................... | H01L 21/28123 |
| | | | 257/347 |
| 2025/0176241 A1 * | 5/2025 | Myung ............... | H10D 30/503 |

FOREIGN PATENT DOCUMENTS

| | | |
|---|---|---|
| CN | 108713254 A | 10/2018 |
| CN | 108780813 A | 11/2018 |
| CN | 109786250 A | 5/2019 |
| WO | WO 2017/111774 A1 | 6/2017 |

OTHER PUBLICATIONS

International Search mailed Feb. 10, 2021, directed to International Patent Application No. PCT /CN2020/109815, 3 pages.

Written Opinion of the International Searching Authority mailed Feb. 10, 2021, directed to International Patent Application No. PCT /CN2020/109815, 3 pages.

International Preliminary Report on Patentability issued Nov. 15, 2022, directed to International Patent Application No. PCT /CN2020/109815, 4 pages.

International Preliminary Report on Patentability directed to the related International Patent Application No. PCT/CN2020/109815, mailed on Nov. 15, 2022, 4 pages.

* cited by examiner

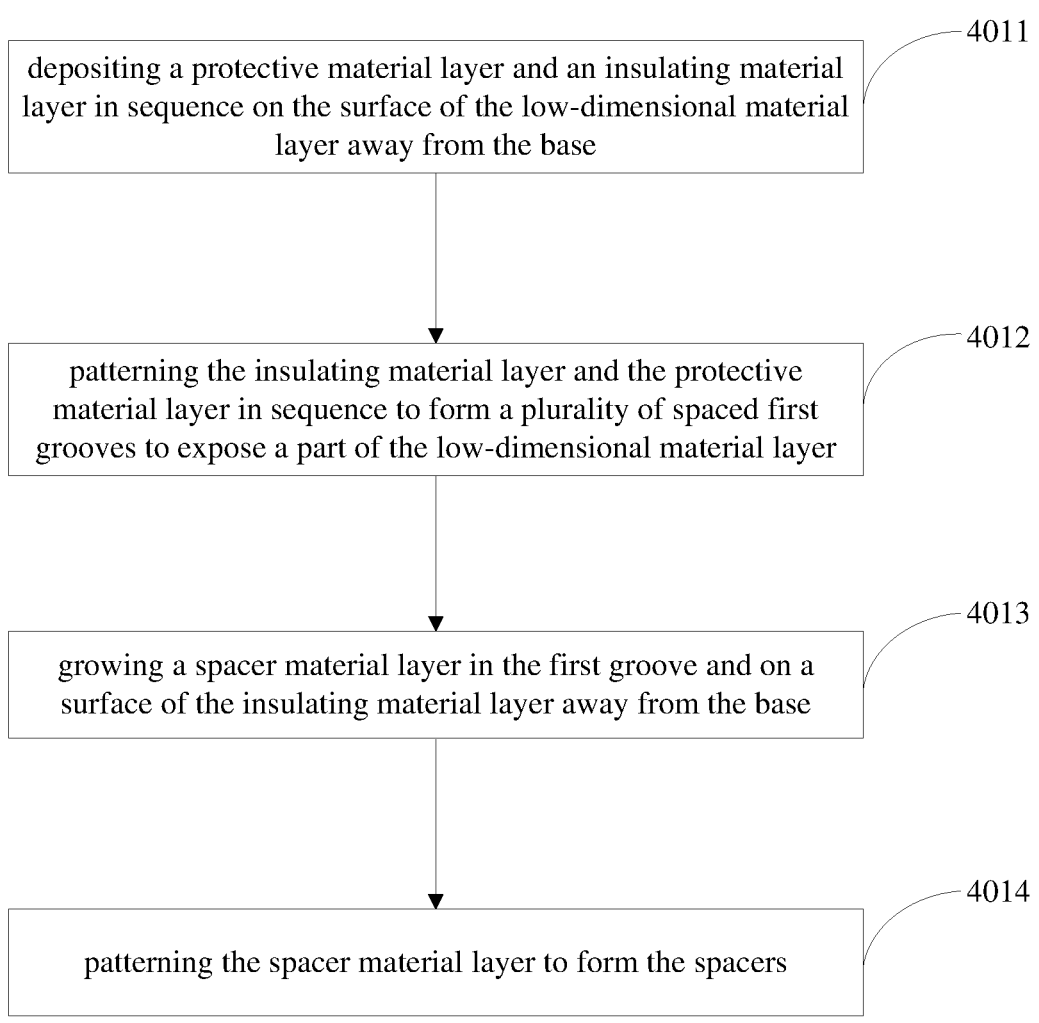

depositing a protective material layer and an insulating material layer in sequence on the surface of the low-dimensional material layer away from the base — 4011 patterning the insulating material layer and the protective material layer in sequence to form a plurality of spaced first grooves to expose a part of the low-dimensional material layer — 4012 growing a spacer material layer in the first groove and on a surface of the insulating material layer away from the base — 4013 patterning the spacer material layer to form the spacers — 4014

Fig. 5

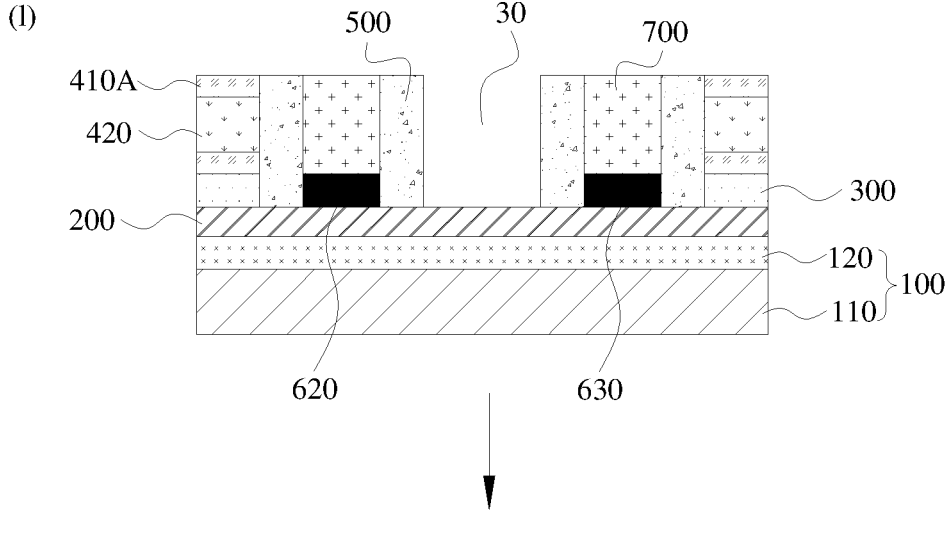
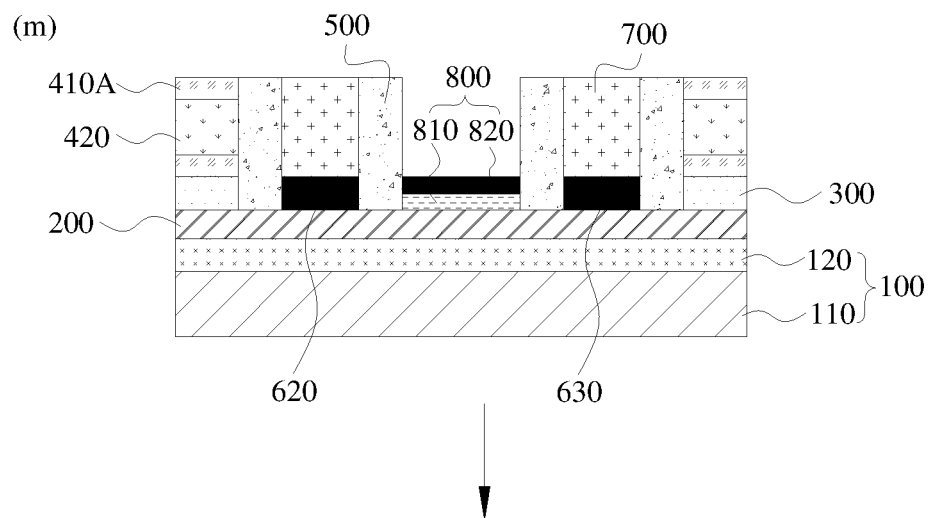
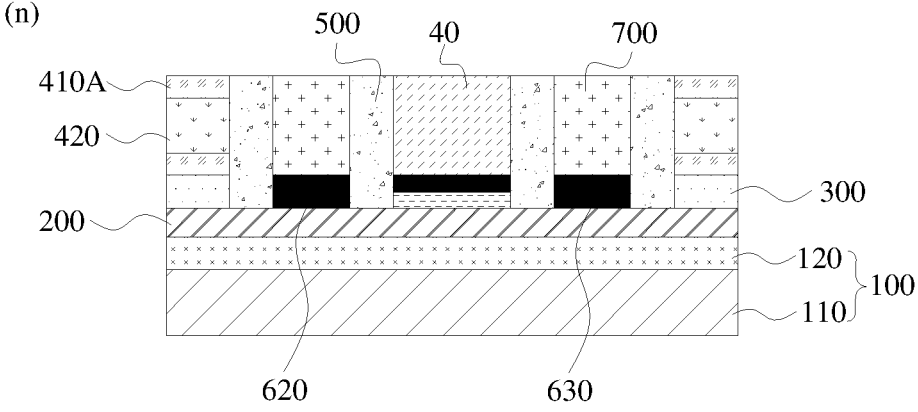
Fig. 10

TRANSISTOR AND METHOD FOR FABRICATING THE SAME

CROSS-REFERENCE TO RELATED APPLICATION

This application claims priority to and benefits of Chinese Patent Application Serial No. 202010393412.1, filed with the National Intellectual Property Administration of P. R. China on May 11, 2010, the entire content of which is incorporated herein by reference.

FIELD

The present disclosure relates to a field of semiconductor technology, in particularly to a transistor and a method for fabricating the transistor.

BACKGROUND

Carbon nanotubes are ideal channel materials for transistors, with excellent physical and chemical characteristics such as one-dimensional nanostructure, ultra-thin thickness, high mobility, perfect lattice, high physical and chemical stability, and high thermal conductivity. Transistors with channels made of carbon nanotubes have not only significant advantages in extreme performance and energy utilization efficiency over traditional transistors, but also have low process cost, high process compatibility and easy three-dimensional integration.

However, a transistor with a channel made of carbon nanotubes and a method for fabricating the transistor still need to be improved.

SUMMARY

The present application is based on inventors' discoveries and recognitions of the following facts and issues.

Currently, transistors with channels made of carbon nanotubes also encounter performance problems such as poor actual operation performance, incompatibility between fabrication processes and mass manufacture, and poor device uniformity.

Embodiments of the present disclosure seek to solve at least one of the problems existing in the related art to at least some extent.

In accordance with a first aspect of the present disclosure, a transistor is provided. The transistor includes a base, a low-dimensional material layer, a plurality of spacers, a source, a drain, and a gate stack. The low-dimensional material layer is provided above the base. The plurality of spacers is provided on a surface of the low-dimensional material layer away from the base and spaced apart from each other. The source and the drain are provided on the surface of the low-dimensional material layer away from the base, respectively. The gate stack is provided on the surface of the low-dimensional material layer away from the base and between the source and the drain, in which the gate stack, the source and the drain are separated by the spacers, and in contact with the spacers, respectively. Therefore, the transistor has advantages of excellent comprehensive performance, high process compatibility, and good device uniformity.

In an embodiment, a part of the spacer is located between the low-dimensional material layer and the base, and the other part of the spacer is located on the surface of the low-dimensional material layer away from the base. The gate stack includes a gate dielectric layer and a gate metal layer. The gate dielectric layer includes a first part located between the low-dimensional material layer and the base and a second part located on the surface of the low-dimensional material layer away from the base. A part of the gate metal layer is located between the first part and the base, and the other part of the gate metal layer is located on a surface of the second part away from the base. A part of the source is located between the low-dimensional material layer and the base, and the other part of the source is located on the surface of the low-dimensional material layer away from the base. A part of the drain is located between the low-dimensional material layer and the base, and the other part of the drain is located on the surface of the low-dimensional material layer away from the base. Therefore, a gate-all-around structure as the gate stack can further improve the gate control and make the transistor have better electrostatics. Moreover, the built-in or wrap-around contact formed by the low-dimensional material layer and the source and drain can reduce a contact resistance, improve a thermal stability of the source and drain contacts, and eliminate an influence of the base on the contact. Furthermore, the spacer can be used to fix the low-dimensional material layer to prevent the low-dimensional material layer from moving in forming the source, the drain and the gate stack, respectively.

In an embodiment, the low-dimensional material layer includes a plurality of low-dimensional material sub-layers, and a space between two adjacent low-dimensional material sub-layers is filled by a part of the spacer, a part of the source, a part of the drain and a part of the gate stack. Therefore, the performance of the transistor can be further improved.

In an embodiment, a material for the low-dimensional material layer is at least one of carbon nanotubes, nanowires, and two-dimensional materials. Therefore, the transistor with a channel made of the above materials has excellent performance.

In an embodiment, the spacer has a fixed charge or dipole. Therefore, the threshold voltage, on current, off current, and switching state of the transistor can be well adjusted.

In an embodiment, the transistor further includes a gate interconnect metal layer provided on a surface of the gate stack away from the base and between the spacers. Therefore, the interconnection between the gate stacks facilitates an application of a voltage to the gate stack.

In an embodiment, the base further includes a source interconnect metal layer connected to the source and a drain interconnect metal layer connected to the drain. Therefore, the source interconnect metal layer and the drain interconnect metal layer facilitate the interconnection between the sources and between the drains, respectively, and reduce the parasitic capacitance between the gate and the source and between the gate and the drain, thus further improving the performance of the transistor.

In accordance with a second aspect of the present disclosure, a method for forming a transistor is provided. The method includes: forming a low-dimensional material layer above a base, and forming a plurality of spacers on a surface of the low-dimensional material layer away from the base, the spacers being spaced apart from each other; forming a source and a drain on the surface of the low-dimensional material layer away from the base; forming a gate stack on the surface of the low-dimensional material layer away from the base and between the source and the drain, in which the gate stack, the source and the drain are separated by the spacers, and in contact with the spacers, respectively. Therefore, the method has advantages of low cost, simple process, large-scale manufacture and high compatibility, and can effectively improve the uniformity of the transistor.

In an embodiment, forming the plurality of spacers includes: depositing a protective material layer and an insulating material layer in sequence on the surface of the low-dimensional material layer away from the base; patterning the insulating material layer and the protective material layer in sequence to form a plurality of spaced first grooves to expose a part of the low-dimensional material layer; growing a spacer material layer in the first groove and on a surface of the insulating material layer away from the base; and patterning the spacer material layer to form the spacers.

Therefore, a plurality of spaced spacers can be easily formed, and the spacers can be used as self-alignment masks to form the source, the drain and the gate in the subsequent steps. The self-alignment mask process can control position relationships between the source and the gate and between the drain and the gate well to reduce the process complexity and control sizes and morphology of the source, the drain and the gate to improve the uniformity of the transistor.

In an embodiment, growing the spacer material layer is performed by at least one selected from atomic layer deposition (ALD), chemical vapor deposition (CVD) and physical vapor deposition (PVD). Therefore, the first groove with a high aspect ratio can be filled with the material of the spacer material layer well without gaps in the first groove to avoid forming defects in the spacer material layer.

In an embodiment, patterning the spacer material layer is performed by at least one selected from reactive ion etching and chemical mechanical polishing. Therefore, a simple process for patterning the spacer material layer is provided.

In an embodiment, the insulating material layer includes a plurality of stacked insulating sub-layers with a thickness of 100 to 3000 nm. Therefore, the insulating material layer can facilitate the formation of the spacer, the source, the drain and the gate stack in the subsequent steps.

In an embodiment, a deposition temperature of the insulating material layer is lower than 400° C. Therefore, the insulating material layer can be deposited at a lower temperature to further improve the compatibility of the manufacturing process.

In an embodiment, a deposition temperature of the protective material layer is lower than 400° C. Therefore, the protective material layer can be deposited at a lower temperature to further improve the compatibility of the manufacturing process.

In an embodiment, patterning the protective material layer includes chemically etching the protective material layer with a reactive solution or a reactive gas, and washing the etched protective material layer with water. Therefore, a lattice structure of the low-dimensional material will not be destroyed, and the low-dimensional material layer will not be damaged or polluted when the first groove is formed.

In an embodiment, the reactive solution includes an acidic solution or an alkaline solution. Therefore, it is possible to pattern the protective material layer by the reaction of the protective material with the acidic solution or the alkaline solution, such that the lattice structure of the low-dimensional material will not be destroyed and the low-dimensional material layer will not be damaged or polluted in the reaction.

In an embodiment, the acidic solution includes at least one selected from hydrochloric acid, acetic acid, nitric acid, phosphoric acid and sulphuric acid. Therefore, it is possible to remove a part of the protective material layer by the reaction between the protective material and the above acidic solution, such that the lattice structure of the low-dimensional material will not be destroyed and the low-dimensional material layer will not be damaged or polluted.

In an embodiment, the alkaline solution includes at least one selected from potassium hydroxide, sodium hydroxide and tetramethylammonium hydroxide. Therefore, it is possible to remove a part of the protective material layer by the reaction between the protective material and the above alkaline solution, such that the lattice structure of the low-dimensional material will not be destroyed and the low-dimensional material layer will not be damaged or polluted.

In an embodiment, the reactive gas includes at least one selected from hydrogen chloride and hydrogen fluoride. Therefore, it is possible to remove a part of the protective material layer by the reaction between the protective material and the above reactive gas, such that the lattice structure of the low-dimensional material will not be destroyed.

In an embodiment, a material for the protective material layer includes at least one selected from yttrium oxide, lanthanum oxide, scandium oxide, silicon oxide, and aluminum oxide. Therefore, the protective material layer can protect the low-dimensional material layer from damage and pollution in subsequent etching processes or deposition processes. When the protective material layer is etched, the lattice structure of the low-dimensional material will not be damaged, the low-dimensional material layer will not be damaged or polluted, and impurities and molecules adsorbed on the surface of the low-dimensional material layer can be removed to improve a performance of the low-dimensional material layer.

In an embodiment, a thickness of the protective material layer is in a range of 3 to 50 nm. Therefore, the protective material layer can protect the low-dimensional material layer, and lateral etching or other defects caused by the excessive thickness of the protective material layer can be alleviated in etching the protective material layer.

In an embodiment, before depositing the protective material layer on the surface of the low-dimensional material layer away from the base, the method further includes: forming another protective material layer between the base and the low-dimensional material layer. Therefore, in the subsequent steps, the protective material layer is etched to suspend the low-dimensional material layer and finally obtain a transistor with a gate-all-around structure to improve gate control and achieve better electrostatics, as well as wrap-around contact to improve the contact quality as mentioned above.

In an embodiment, forming the source and the drain includes: patterning the insulating material layer and the protective material layer between two adjacent spacers in sequence to form a plurality of second grooves to expose a part of the low-dimensional material layer; forming in the second grooves the source and the drain separated by the spacers. Therefore, when the source and the drain are formed, the spacer as a self-alignment mask can control the position of the source and the drain well to reduce the process complexity and control sizes and morphology of the source and the drain well to improve the uniformity of the transistor.

In an embodiment, forming the source and the drain in the second grooves includes: forming a metal material layer in the second groove and on surfaces of the spacer and the insulating material layer away from the base; forming a dielectric protection material layer on a surface of the metal material layer away from the base; patterning the dielectric protection material layer to expose the metal material layer on the surfaces of the spacer and the insulating material layer away from the base; removing the metal material layer on the surfaces of the spacer and the insulating material layer away from the base to obtain the source and the drain. Therefore, the dielectric protection material layer can prevent the source, the drain and the low-dimensional material layer from being damaged by the etching process.

In an embodiment, forming the metal material layer is performed by physical vapor deposition or atomic layer deposition. Therefore, the metal material can be deposited well. When the low-dimensional material layer is suspended, wrap-around contacts may be formed to further improve the contact quality.

In an embodiment, forming the dielectric protection material layer is performed by at least one of atomic layer deposition, chemical vapor deposition, and physical vapor deposition. Therefore, the second groove with a high aspect ratio can be filled with the material of the dielectric protection material layer well without gaps in the second groove to avoid forming defects in the dielectric protection material layer.

In an embodiment, patterning the dielectric protection material layer is performed by at least one selected from reactive ion etching and chemical mechanical polishing. Therefore, a simple process for patterning the dielectric protection material layer is provided.

In an embodiment, forming the gate stack includes: patterning the insulating material layer and the protective material layer between two spacers between the source and the drain in sequence to form a third groove to expose a part of the low-dimensional material layer, and forming the gate stack in the third groove. Therefore, when the gate is formed, the spacer as a self-alignment mask can control the position of the gate to reduce the process complexity and control the size and morphology of the gate well to improve the uniformity of the transistor.

In an embodiment, a gate dielectric layer and a gate metal layer are sequentially formed in the third groove to form the gate stack, and the gate dielectric layer and the gate metal layer are formed by at least one of atomic layer deposition, chemical vapor deposition and physical vapor deposition. Therefore, a process for forming the gate stack may be provided. When the low-dimensional material layer is suspended, a wrap-around gate may be formed to further improve gate control and achieve better electrostatics of the transistor.

In an embodiment, the low-dimensional material layer includes a plurality of low-dimensional material sub-layers, and a protective material layer is located between two adjacent low-dimensional material sub-layers. Therefore, the performance of the transistor can be further improved.

In an embodiment, after each of the first groove, the second groove and the third groove is formed, the method further includes cleaning a respective exposed part of the low-dimensional material layer by wet cleaning. Therefore, impurities, molecules, polymers and/or other substances adhering on the surface of the low-dimensional material layer can be removed simply to make the low-dimensional material layer have a clean surface and a better performance.

In an embodiment, the low-dimensional material layer is electrostatically doped by a fixed charge or a dipole in the spacer. Therefore, the threshold voltage, on current, off current and switching state of the transistor can be well adjusted.

In an embodiment, a material for the low-dimensional material layer is at least one of carbon nanotubes, nanowires, and two-dimensional materials. Therefore, the transistor with a channel made of the above materials has excellent performance.

BRIEF DESCRIPTION OF THE DRAWINGS

These and other aspects and advantages of embodiments of the present disclosure will become apparent and more readily appreciated from the following descriptions made with reference to the drawings, in which:

FIG. 5 is a flow chart of a process for forming spacers according to an embodiment of the present disclosure;

FIG. 10 shows schematic cross-sectional views of structures obtained in a method for forming a transistor according to an embodiment of the present disclosure;

DETAILED DESCRIPTION

Figure 1:
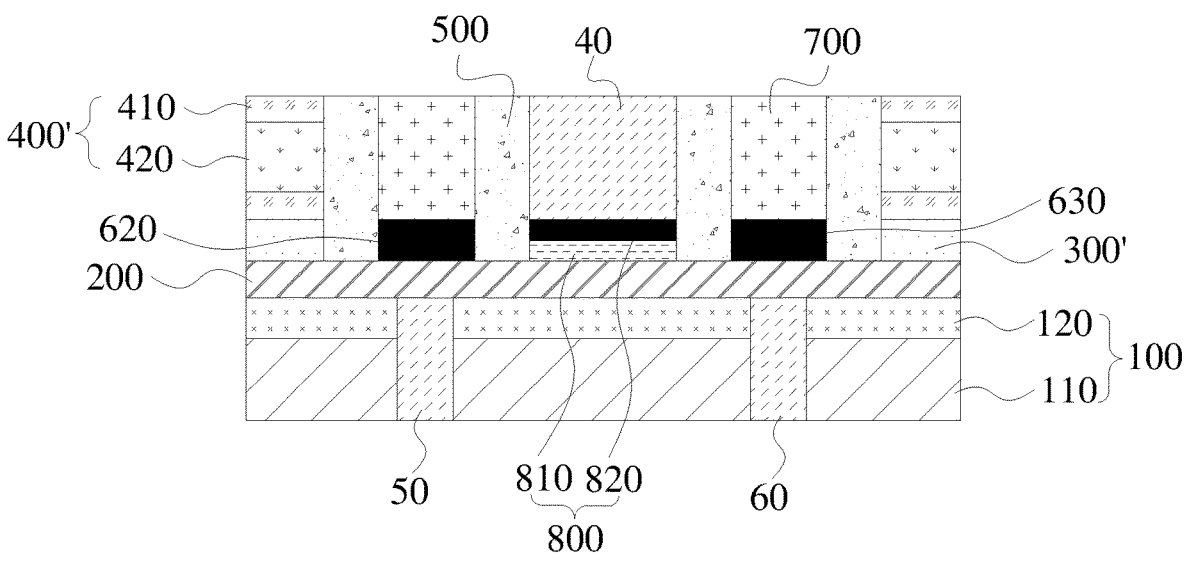
FIG. 1 is a schematic cross-sectional view of a transistor according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

In accordance with a first aspect of the present disclosure, a transistor is provided. According to embodiments of the present disclosure, with reference to FIG. 1, the transistor includes: a base 100, a low-dimensional material layer 200, a plurality of spacers 500, a source 620, a drain 630 and a gate stack 800. The low-dimensional material layer 200 is provided above the base 100. The spacers 500 are provided on a surface of the low-dimensional material layer 200 away from the base 100 and spaced apart from each other. The source 620 and the drain 630 are provided on the surface of the low-dimensional material layer 200 away from the base 100, respectively. The gate stack 800 is provided on the surface of the low-dimensional material layer 200 away from the base 100 and between the source 620 and the drain 630, in which the gate stack 800, the source 620 and the drain 630 are separated by the spacers 500, and are in contact with the spacers 500, respectively. Therefore, the transistor has advantages of excellent comprehensive performance, low cost, mass manufacture, simple fabrication techniques and high process compatibility.

According to embodiments of the present disclosure, a plurality of spacers is provided in the transistor to limit the position of the source, the drain and the gate. In the process of fabricating the transistor, by using the spacers as self-aligned masks for forming the source, the drain and the gate, it is possible to control position relationships, sizes and morphology of the source, the drain and the gate to improve the uniformity of the transistor and reduce the process difficulty and cost.

Each structure of the transistor according to embodiments of the present disclosure will be described in details below.

According to embodiments of the present disclosure, the base 100 may include a substrate 110 and an electrically-insulating and heat-conducting layer 120 formed on the substrate 110. The materials for the substrate and the electrically-insulating and heat-conducting layer are not particularly limited. For example, the material for the substrate may include, but is not limited to, a semiconductor, glass or a polymer, and the material for the electrically-insulating and heat-conducting layer may include a nitride. Therefore, the electrically-insulating and heat-conducting layer has good thermal conductivity. In addition, the dense nitride can form a stable interface with the gate dielectric layer, and has good thermal stability and thermodynamic stability during the heat treatment.

According to embodiments of the present disclosure, a material for the low-dimensional material layer 200 is at least one of carbon nanotubes, nanowires, and two-dimensional materials. Specifically, the carbon nanotubes may be a single carbon nanotube, network carbon nanotubes or oriented carbon nanotube arrays, and the two-dimensional materials may include, e.g., black phosphorus or molybdenum disulfide. Therefore, the transistor with a channel made of the above materials has excellent performance. Preferably, the material for the low-dimensional material layer may be single-walled carbon nanotubes. The transistors with channels made of the single-walled carbon nanotubes have better performance since the single-walled carbon nanotubes have higher mobility and fewer surface dangling bonds than other low-dimensional materials.

According to embodiments of the present disclosure, with reference to FIG. 1, the transistor may further include a protective layer 300' provided on a surface of the low-dimensional material layer 200 away from the base 100 and an insulating layer 400' provided on a surface of the protective layer 300' away from the base 100. A part of the protective layer 300' and a part of the insulating layer 400' are located on a side of a first spacer 500 away from the source 620, e.g., on a left side of a leftmost spacer 500, and a remaining part of the protective layer 300' and a remaining part of the insulating layer 400' are located on a side of a second spacer 500 away from the drain 630, e.g., on a right side of a rightmost spacer 500. The protective layer 300' and the insulating layer 400' are final remaining parts of a protective material layer and an insulating material layer after the protective material layer and the insulating material layer on the low-dimensional material layer are patterned in the process of fabricating the transistor. In the process of fabricating the transistor, the protective material layer can protect the low-dimensional material layer from pollution and damage, and the insulating material layer can facilitate the preparation of the spacer, the source, the drain and the gate stack.

According to embodiments of the present disclosure, the insulating layer 400' may include a plurality of stacked insulating sub-layers such as a first insulating sub-layer 410 and a second insulating sub-layer 420 as shown in FIG. 1, and the thickness of the insulating layer 400' may be in a range of 100 to 3000 nm, such as 100 nm, 500 nm, 800 nm, 1000 nm, 1500 nm, 1800 nm, 2000 nm, 2500 nm, 2800 nm, or 3000 nm. Therefore, in the process of fabricating the transistor, the insulating material layer can facilitate the preparation of the spacer, the source, the drain and the gate stack. The material for the insulating layer is not particularly limited, and can be selected by the skilled person in the art from insulating materials commonly used in transistors. For example, according to embodiments of the present disclosure, the material for the insulating layer may include at least one of oxides, nitrides, and organic materials. For example, a plurality of insulating sub-layers may be used as an anti-etching layer, a planarization layer, an anti-reflection layer, and a stop layer of a chemical mechanical polishing (CMP) process, respectively.

According to embodiments of the present disclosure, in the process of forming the protective layer 300', the material for the protective layer 300' may be such that the protective layer 300' is patterned by a non-destructive chemical etching process to remove a part of the protective material to form the protective layer 300' without destroying a lattice structure of the low-dimensional material and damaging or polluting the low-dimensional material layer in the patterning process. The specific material for the protective layer 300' is not particularly limited as long as the above conditions are satisfied. For example, the material for the protective layer 300' may include at least one of yttrium oxide, lanthanum oxide, scandium oxide, silicon oxide, and aluminum oxide.

Therefore, the above materials have good wettability to the low-dimensional material layer, and the deposition of the above materials will not damage the low-dimensional material layer. During the process of fabricating the transistor, the protective material layer can protect the low-dimensional material layer from damage and pollution when other layers on the protective material layer are etched or deposited, and impurities and molecules adsorbed on the surface of the low-dimensional material layer can be removed without damaging or polluting the low-dimensional material layer to improve the performance of the low-dimensional material layer when the protective material layer made of the above materials is etched.

According to embodiments of the present disclosure, the thickness of the protective layer 300' may be in a range of 3 to 50 nm, preferably 3 to 20 nm, such as 5 nm, 8 nm, 10 nm, 15 nm, 18 nm, or 20 nm. Therefore, the protective material layer can protect the low-dimensional material layer in fabricating the transistor, and lateral etching or other defects caused by the excessive thickness of the protective material layer can be alleviated in etching the protective material layer.

Figure 2:
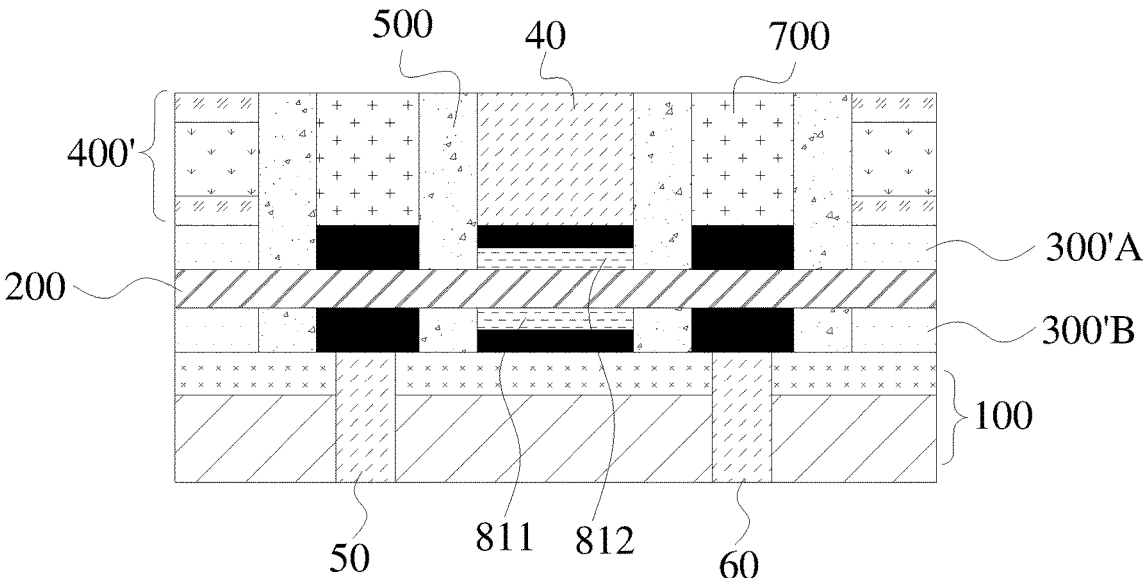
FIG. 2 is a schematic cross-sectional view of a transistor according to another embodiment of the present disclosure.

According to embodiments of the present disclosure, with reference to FIG. 2, a part of the spacer 500 is located between the low-dimensional material layer 200 and the base 100, and the other part of the spacer 500 is located on the surface of the low-dimensional material layer 200 away from the base 100. The gate stack 800 includes a gate dielectric layer 810 and a gate metal layer 820. The gate dielectric layer 810 includes a first part 811 located between the low-dimensional material layer 20 and the base 100 and a second part 812 located on the surface of the low-dimensional material layer 200 away from the base 100. A part of the gate metal layer 820 is located between the first part 811 and the base 100, and the other part of the gate metal layer 820 is located on a surface of the second part 812 away from the base 100. A part of the source 620 is located between the low-dimensional material layer 200 and the base 100, and the other part of the source 620 is located on the surface of the low-dimensional material layer 200 away from the base 100. A part of the drain 630 is located between the low-dimensional material layer 200 and the base 100, and the other part of the drain 630 is located on the surface of the low-dimensional material layer 200 away from the base 100. That is, each of the spacer, the gate dielectric layer, the source and the drain surrounds the low-dimensional material layer, and the gate metal layer surrounds the gate dielectric layer. Therefore, a gate-all-around structure as the gate stack can further improve the gate control and make the transistor obtain better electrostatics, and the built-in or wrap-around contact formed by the low-dimensional material layer and the source and drain respectively enables effective contact therebetween, which can reduce a contact resistance and further improve contact quality. In contrast to the source and the drain covered on a top of the base (with reference to FIG. 1), the wrap-around structure of the source and the drain can avoid the influence of the base on the contact quality between the source and the low-dimensional material layer or between the drain and the low-dimensional material layer, and prevent the contact quality of the source and drain and the low-dimensional material layer from being reduced due to thermal expansion and stress during the heat treatment process. The spacer can fix the low-dimensional material layer to prevent the low-dimensional material layer from moving in forming the source, the drain and the gate stack.

In other words, a protective layer 300'B may be further provided between the low-dimensional material layer 200 and the base 100. In the process of fabricating the transistor, the protective layer 300'B is a final remaining part of a protective material layer after the protective material layer between the low-dimensional material layer and the base is patterned. Therefore, in the process of fabricating the transistor, the suspended low-dimensional material layer makes it possible to obtain a gate-all-around structure (as the gate stack in FIG. 2) to further improve the gate control and achieve better electrostatics, and to obtain a wrap-around source and a wrap-around drain to further improve contact quality and reduce source-drain contact resistance.

According to embodiments of the present disclosure, with reference to FIG. 1, the transistor may further include a dielectric protection layer 700. The dielectric protection layer 700 is provided on surfaces of the source 620 and the drain 630 away from the base 100 and between the spacers 500. In the process of fabricating the transistor, the dielectric protection layer 700 is a remaining part of a dielectric protection material layer after the dielectric protection material layer on the surfaces of the source and drain away from the base is patterned. Therefore, in the process of fabricating the transistor, the dielectric protection layer can prevent the source, the drain and low-dimensional material layer from being damaged by the etching.

According to embodiments of the present disclosure, with reference to FIG. 1, surfaces of the spacer 500, the insulating layer 400' and the dielectric protection layer 700 away from the base 100 may be flush. Therefore, in the process of fabricating the transistor, the spacers 500 can be used as self-alignment masks to form the source, the drain and the gate. The self-alignment mask process can control position relationships between the source and the gate and between the drain and the gate well, and control sizes and morphology of the source, the drain and the gate to improve the uniformity of the transistor and make the transistor have a flat surface.

According to embodiments of the present disclosure, the spacer 500 has a fixed charge. Specifically, the spacer 500 may be composed of a material with a fixed charge. Alternatively, a part of the spacer 500 near the low-dimensional material layer 200 is composed of a material with a fixed charge, and another part of the spacer 500 away from the low-dimensional material layer 200 is composed of a low dielectric constant material, so as to introduce the fixed charge into the spacer and further reduce the parasitic capacitance. By using a fixed charge to electrostatically dope the low-dimensional material layer below the spacer, the threshold voltage, on current, off current and switching state of the transistor can be well adjusted without affecting the gate control capability of the gate.

According to embodiments of the present disclosure, the spacer 500 has a dipole. Specifically, the spacer 500 may be composed of two materials, and a dipole is formed at an interface of the two materials. For example, for a transistor with a suspended low-dimensional material layer, atomic layer deposition is used to deposit a first spacer material and a second spacer material in sequence such that a spacer material layer wraps around the low-dimensional material layer, and a dipole is formed at an interface between the first spacer material and the second spacer material. Alternatively, for a transistor with the low-dimensional material layer directly provided on the base, dipoles can be also introduced into the spacers, for example, a first spacer material and a second spacer material are deposited in sequence by at least one of atomic layer deposition, chemical vapor deposition or physical vapor deposition, and a dipole is formed at an interface between the first spacer material and the second spacer material. By using a dipole to electrostatically dope the low-dimensional material layer below or within the spacer, the threshold voltage, on current, off current and switching state of the transistor can be well adjusted without affecting the gate control capability of the gate.

According to embodiments of the present disclosure, by adjusting the size of the spacer, or adjusting the density and distribution of the fixed charge in the spacer, or adjusting the direction and magnitude of the dipole moment in the spacer and the distance of the dipole from the low-dimensional material layer, the threshold voltage, on current, off current and switching state of the transistor can be well controlled.

Figure 3:
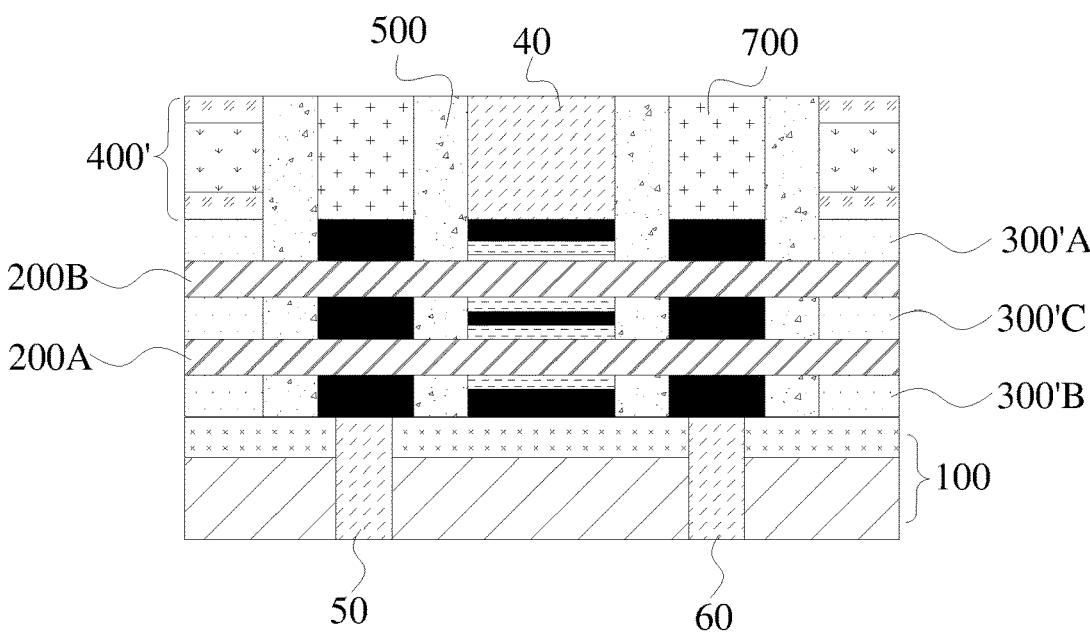
FIG. 3 is a schematic cross-sectional view of a transistor according to still another embodiment of the present disclosure.

According to embodiments of the present disclosure, with reference to FIG. 3, the low-dimensional material layer 200 may further include a plurality of low-dimensional material sub-layers (200A and 200B as shown in FIG. 3), and a part of the spacer 500, a part of the source 620, a part of the drain 630, and a part of the gate stack 800 are filled between two adjacent low-dimensional material sub-layers, in which the filled gate stack includes a gate dielectric layer surrounding the low-dimensional material layer and a gate metal layer surrounding the gate dielectric layer. Thus, with reference to FIG. 3, a vertically stacked structure of the low-dimensional material layer is obtained. As the number of low-dimensional material layers increases, the driving capability of the transistor is higher, and the performance of the transistor is significantly improved without increasing the area of the transistor, and a gate-all-around structure a wrap-around source and a wrap-around drain may be formed. In other words, with reference to FIG. 3, a protective layer 300'C is provided between two adjacent low-dimensional material sub-layers. In the process of fabricating a transistor, the protective layer 300'C is a remaining part of a protective material layer after the protective material layer formed between two adjacent low-dimensional material sub-layers is patterned.

According to embodiments of the present disclosure, with reference to FIG. 1 to FIG. 3, the transistor further includes a gate interconnect metal layer 40 provided on a surface of the gate stack 800 away from the base 100 and between the spacers 500. Therefore, the gate interconnect metal layer facilitates the interconnection between the gate stacks to facilitate the application of a voltage to the gate stack.

According to embodiments of the present disclosure, with reference to FIG. 1 to FIG. 3, a source interconnect metal layer 50 connected to the source 620 and a drain interconnect metal layer 60 connected to the drain 630 are provided in the base 100. Specifically, for a transistor provided with a protective layer between the low-dimensional material layer and the base, the source interconnect metal layer 50 is directly connected to the source 620, and the drain interconnect metal layer 60 is directly connected to the drain 630, as shown in FIG. 2 and FIG. 3. For a transistor with the low-dimensional material layer directly provided on the base, the low-dimensional material layer does not cover the underlying base completely, for example, the low-dimensional material layer is carbon nanotubes with a certain density, and the source interconnection metal layer 50 directly connects to the source 620, and the drain interconnection metal layer 60 directly connects to the drain 630, thus achieving an approximately wrap-around or built-in structure of the source and the drain. That is, the source and the drain not only cover a surface of the carbon nanotube, but also fill in a region between adjacent carbon nanotubes to form a wrap-around or built-in structure of the source and the drain. Alternatively, the low-dimensional material layer covers the underlying base completely, for example, the low-dimensional material layer is made of molybdenum disulfide as a two-dimensional semiconductor material. In this case, the orthogonally projected area of each of the source interconnection metal layer 50 and the source 620 on the base 100 is larger than that of the low-dimensional material layer 200 on the base 100, so that the source interconnect metal layer 50 and the source 620 can be connected via parts thereof beyond the low-dimensional material layer 200 to form a source with an approximately wrap-around or built-in structure. Similarly, the orthogonally projected area of each of the drain interconnection metal layer 60 and the drain 630 on the base 100 is larger than that of the low-dimensional material layer 200 on the base 100, so that the drain interconnect metal layer 60 and the drain 630 can be connected via parts thereof beyond the low-dimensional material layer 200 to form a drain with an approximately wrap-around or built-in structure. Therefore, the wrap-around or built-in structure facilitates the interconnection between the sources or between the drains. The source interconnect metal layer and the drain interconnect metal layer in the base can reduce the parasitic capacitance between the source and the gate and between the drain and the gate to further improve the performance of the transistor.

In summary, the transistor has advantages of controllable threshold voltage, off-state tunneling inhibition, low parasitic capacitance, improved contact quality, excellent gate control and electrostatic control. The fabricating method has advantages of a self-aligned process, strong process compatibility, compatibility with large-scale fabricating process, easy three-dimensional integration, simple process and low cost. Moreover, the vertical channel stacking, the gate-all-around structure, the wrap-around source structure and the wrap-around drain structure can be achieved.

In accordance with a second aspect of the present disclosure, a method for fabricating a transistor is provided. According to an embodiment of the present disclosure, the transistor fabricated by this method may be the transistor described above. Therefore, the transistor fabricated by this method has the same features and advantages as the transistor described above, which will not be repeatedly explained here.

Figure 4:
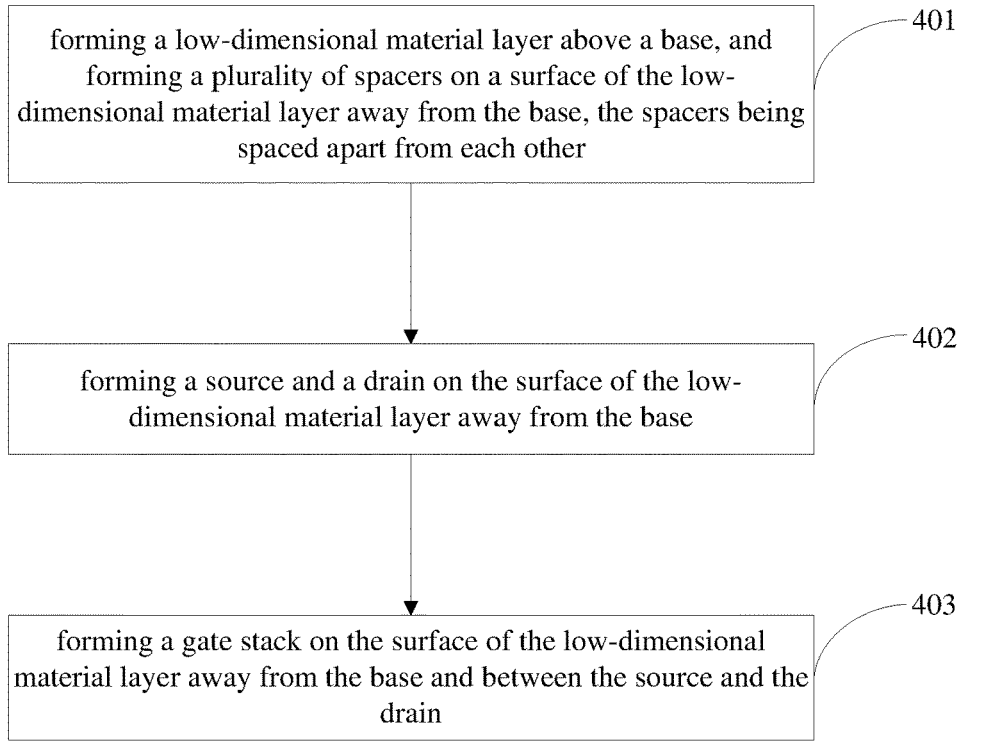
FIG. 4 is a flow chart of a method for forming a transistor according to an embodiment of the present disclosure.

According to an embodiment of the present disclosure, with reference to FIG. 4, the method includes steps 401 to 403 as follows:

In step 401, a low-dimensional material layer is formed above the base, and a plurality of spacers is formed on a surface of the low-dimensional material layer away from the base, in which the spacers are spaced apart from each other.

The base has the same structure as described in detail above, which will not be repeatedly explained here. For example, the base may include a substrate and an electrically-insulating and thermally-conducting layer formed on the substrate. According to an embodiment of the present disclosure, in this step, a source interconnect metal layer and a drain interconnect metal layer may also be formed in the base in advance to connect the source interconnect metal layer and the subsequently formed source and connect the drain interconnect metal layer and the subsequently formed drain. Thus, the parasitic capacitance between the source and the gate and between the drain and the gate can be reduced, and the fabricating process can be simplified.

The material for the low-dimensional material layer has been described in detail above, and will not be repeatedly explained here. For example, the material for the low-dimensional material layer may include at least one of carbon nanotubes, nanowires, and two-dimensional materials. Therefore, the transistor with the channel made of the above materials has excellent performance.

Figure 6:
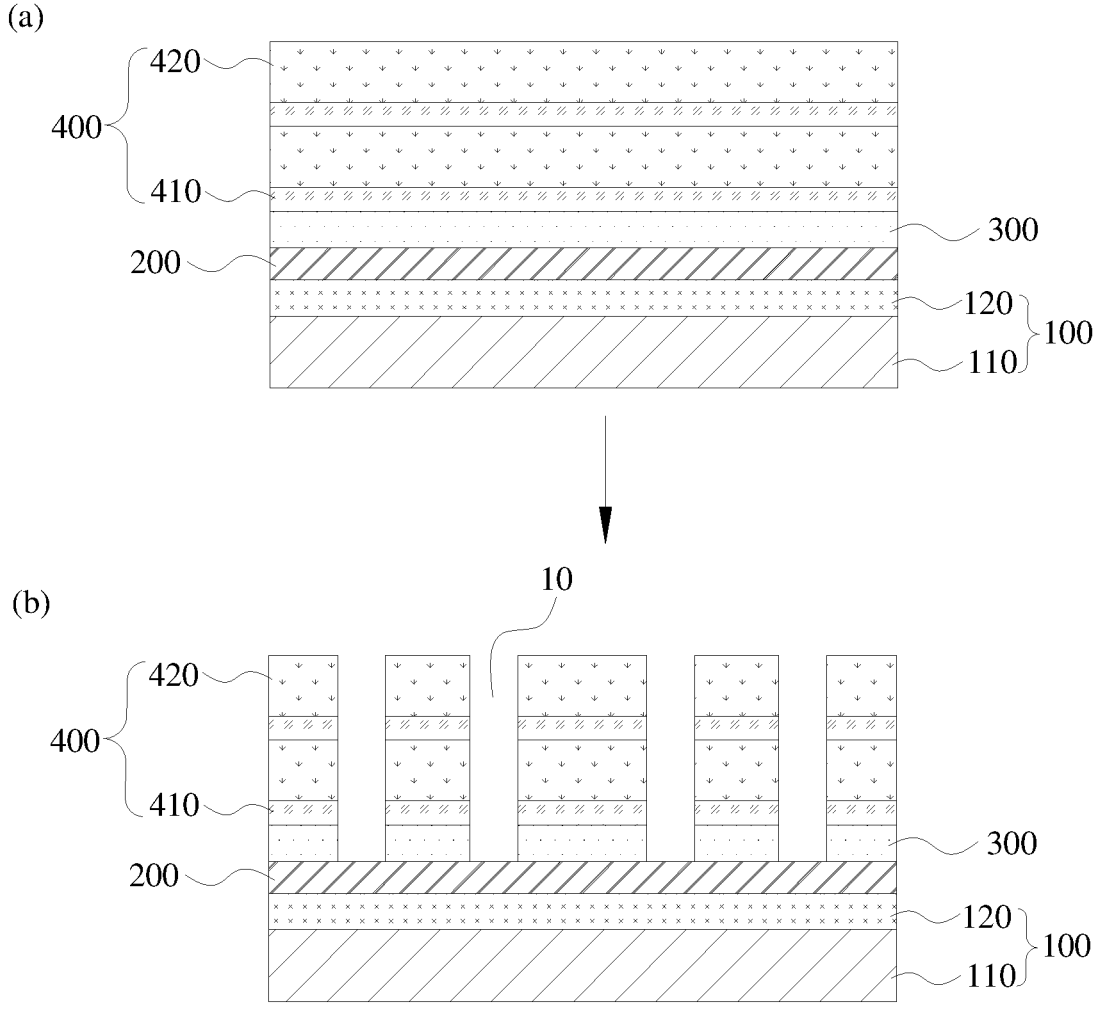
FIG. 6 shows schematic cross-sectional views of structures obtained in a method for forming a transistor according to an embodiment of the present disclosure.

According to an embodiment of the present disclosure, with reference to FIG. 5, forming the spacer may include steps 4011 to 4014 as follows:

In step 4011, a protective material layer 300 and an insulating material layer 400 are sequentially formed on the surface of the low-dimensional material layer away from the base, as shown in FIG. 6 (*a*).

According to embodiments of the present disclosure, the material for the protective material layer may be such that the protective material layer is patterned by a non-destructive chemical etching process to remove a part of the protective material to achieve the patterning of the protective material layer without destroying a lattice structure of the low-dimensional material and damaging or polluting the low-dimensional material layer in the patterning process. The specific material for the protective layer is not particularly limited as long as the above conditions are satisfied. For example, the material for the protective layer may include at least one of yttrium oxide, lanthanum oxide, scandium oxide, silicon oxide, and aluminum oxide. Therefore, in the subsequent steps, the protective material layer can protect the low-dimensional material layer from damage and pollution when other layers on the protective material layer are etched, and impurities and molecules adsorbed on the surface of the low-dimensional material layer can be removed without damaging or polluting the low-dimensional material layer to improve a performance of the low-dimensional material layer when the protective material layer made of the above materials is etched. It should be understood that when the protective material layer is made of silicon oxide, hydrofluoric acid may be used for chemical etching to pattern the protective material layer, and when the protective material layer is made of aluminum oxide, phosphoric acid may be used for chemical etching to pattern the protective material layer. When the low-dimensional material layer is made of carbon nanotubes, due to the presence of gaps between the carbon nanotubes, the thickness of the protective material layer may be such that the protective material layer can completely wrap the carbon nanotubes to protect the carbon nanotubes.

According to an embodiment of the present disclosure, the thickness of the protective material layer may be in a range of 3 to 50 nm. Therefore, the protective material layer can protect the low-dimensional material layer, and lateral etching or other defects caused by the excessive thickness of the protective material layer can be alleviated in etching the protective material layer.

The material and thickness of the insulating material layer have been described in detail above, and will not be repeatedly explained here. For example, the insulating material layer may include a plurality of stacked insulating sub-layers, for example, a first insulating sub-layer 410 and a second insulating sub-layer 420 shown in FIG. 6 (a), and the thickness of the insulating material layer may be in a range of 100 to 3000 nm. Therefore, the insulating material layer may be used for the preparation of the spacer, the source, the drain, and the gate stack in the subsequent steps. According to embodiments of the present disclosure, the number of stacked insulating sub-layers may be designed according to the number of processes of depositing the source, the drain and the gate stack in the subsequent steps. For example, a plurality of insulating sub-layers can be deposited at one time to make the insulating material layer have a predetermined thickness, and the source, the drain and the gate stack are subsequently formed by patterning the insulating material layer multiple times. Alternatively, the insulating sub-layers may be deposited multiple times. For example, some of the insulating sub-layers may be deposited in advance, and after forming the source and the drain, others of the insulating sub-layers may be re-deposited to form the gate stack.

The processes for forming the electrically-insulating and thermally-conducting layer, the protective material layer, and the insulating material layer are not particularly limited. For example, the above layers can be formed by physical vapor deposition (PVD), chemical vapor deposition (CVD), atomic layer deposition (ALD), or spin coating, respectively.

The process for forming the low-dimensional material layer is not particularly limited. For example, the low-dimensional material layer may be formed by physical transfer or solution deposition.

According to an embodiment of the present disclosure, the deposition temperature of the insulating material layer and the protective material layer may both be lower than 400° C. Therefore, the insulating material layer and the protective material layer can be deposited at a lower temperature to further improve the compatibility of the fabricating process.

Figure 11:
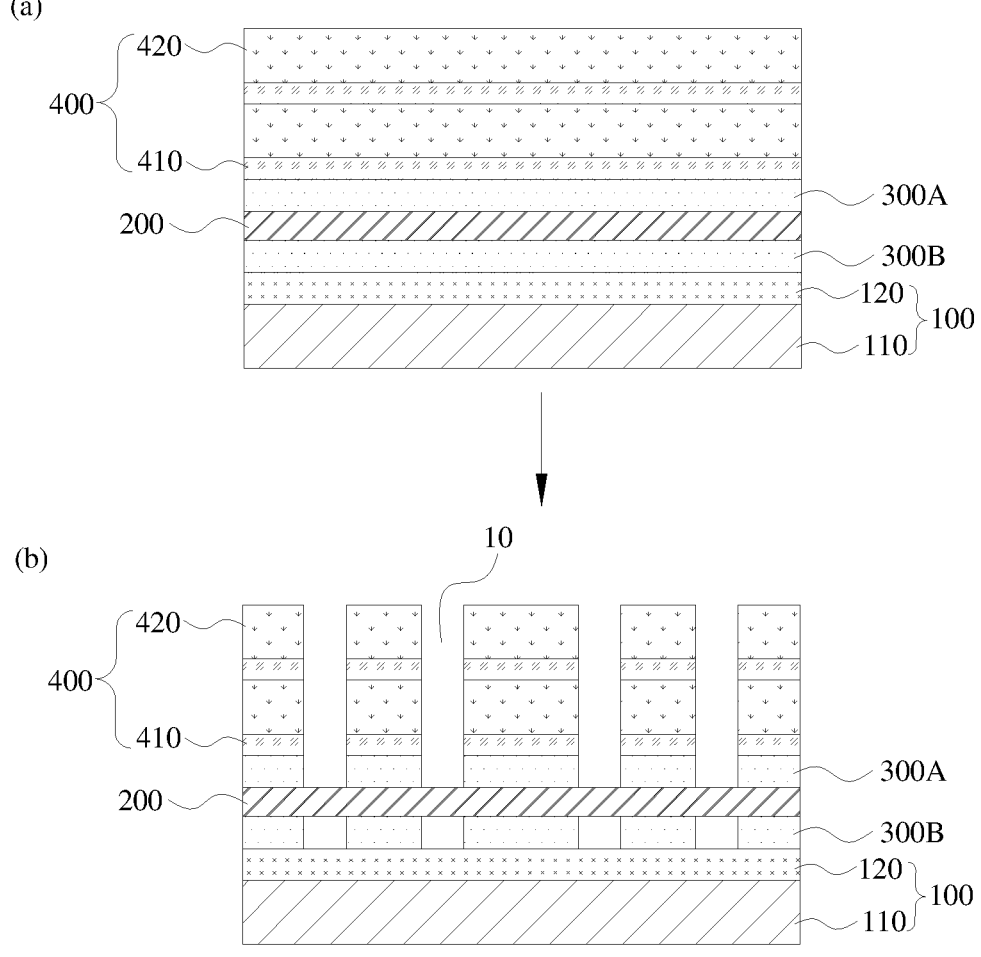
FIG. 11 shows schematic cross-sectional views of structures obtained in a method for forming a transistor according to another embodiment of the present disclosure.
Figure 16:
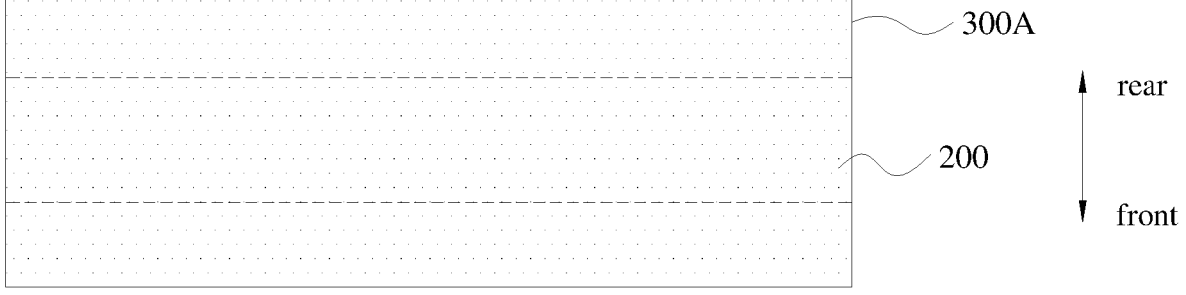
FIG. 16 is a schematic top view of a structure obtained in a method for forming a transistor according to an embodiment of the present disclosure, in which a positional relationship between a low-dimensional material layer and a protective material layer is shown.

According to other embodiments of the present disclosure, in this step, the protective material layer described above may also be formed between the base and the low-dimensional material layer. Specifically, with reference to FIG. 11 (a), a protective material layer 300B is first formed on the electrically-insulating and thermally-conducting layer 120, then a low-dimensional material layer 200 is formed on the protective material layer 300B, then a protective material layer 300A is formed on the low-dimensional material layer 200, and finally an insulating material layer 400 is formed on the protective material layer 300A. Therefore, in the subsequent steps, after the insulating material layer and the protective material layer are patterned (for example, after a first groove, a second groove, and a third groove are subsequently formed), the low-dimensional material layer can be suspended as shown in FIG. 11 (b), and a transistor with a gate-all-around structure is finally obtained as shown in FIG. 2, which further improves gate control and achieves better electrostatics. According to an embodiment of the present disclosure, with reference to FIG. 16, the protective material layer 300A covers the low-dimensional material layer 200 (a part within a dotted frame in FIG. 16), and the protective material layer 300B (not shown in FIG. 16) is provided below the low-dimensional material layer 200. In a front-rear direction, the width of the low-dimensional material layer 200 is less than the widths of the protective material layers 300A and 300B, respectively. Therefore, when the protective material layers are chemically etched, the protective material layer below the low-dimensional material layer can be etched away to suspend the low-dimensional material layer.

According to an embodiment of the present disclosure, the thickness of the protective material layer 300B may be in a range of 3 to 50 nm. The protective material layer with the thickness within the above range can be used to provide the gate dielectric layer and the gate metal layer to form a gate-all-around structure after etching away a part of the protective material layer located in a gate region in the subsequent step. At the same time, lateral etching or other defects caused by the excessive thickness of the protective material layer can be alleviated in etching the protective material layer.

According to some embodiments of the present disclosure, the low-dimensional material layer may be a single-layer structure to obtain transistors shown in FIG. 1 and FIG. 2. According to other embodiments of the present disclosure, the low-dimensional material layer may further include a plurality of low-dimensional material sub-layers, and the protective material layer described above is formed between two adjacent low-dimensional material sub-layers. Therefore, vertical stacking of the low-dimensional material layers is achieved. When the first groove, the second groove and the third groove are formed, the vertically stacked low-dimensional material layer can be suspended to form a gate-all-around structure, a wrap-around source and a wrap-around drain, and obtain the resulting transistor as shown in FIG. 3 to further improve the performance of the transistor.

In step 4012, the insulating material layer and the protective material layer are sequentially patterned to form a plurality of spaced first grooves to expose a part of the low-dimensional material layer. Specifically, first, patterning the insulating material layer to expose the underlying protective material layer may be performed by selective etching to remove a part of the insulating material layer with a patterned photoresist as a mask. More specifically, the selective etching is reactive ion etching. As mentioned above, the insulating material layer includes a plurality of insulating sub-layers, and different insulating sub-layers may be patterned using different etching processes. When the insulating material layer is etched, the low-dimensional material layer can be protected from damage and pollution from the etching process by covering the low-dimensional material layer with the protective material layer. Subsequently, the protective material layer is patterned. Specifically, the protective material layer can be chemically etched using a reactive solution or a reactive gas, and washed with water to pattern the protective material layer. Finally, a plurality of spaced first grooves 10 is formed, and a part of the low-dimensional material layer is exposed, as shown in FIG. 6 (*b*). Therefore, the first grooves can be formed without damage and pollution to the low-dimensional material layer.

According to an embodiment of the present disclosure, the reactive solution may include an acidic solution or an alkaline solution. Therefore, it is possible to pattern the protective material layer by the reaction of the protective material with the acidic solution or the alkaline solution without destroying the lattice structure of the low-dimensional material and damaging or polluting the low-dimensional material layer in the reaction.

The specific components of the acidic solution and the alkaline solution are not particularly limited. For example, the acidic solution may include at least one of hydrochloric acid, acetic acid, nitric acid, phosphoric acid, and sulfuric acid, and the alkaline solution may include at least one of potassium hydroxide, sodium hydroxide, and tetramethylammonium hydroxide. Therefore, it is possible to remove a part of the protective material layer by the reaction of the protective material with the acidic solution or the alkaline solution described above without destroying the lattice structure of the low-dimensional material and damaging or polluting the low-dimensional material layer in the reaction. Taking hydrochloric acid as an acidic solution and an yttrium oxide layer as a protective material layer as an example, hydrochloric acid can react with yttrium oxide to form liquid yttrium chloride, and water can be used to wash away excess hydrochloric acid and yttrium chloride to form grooves. Hydrochloric acid can clean the surface of the low-dimensional material layer without destroying the properties of the low-dimensional material layer, and remove impurities introduced in the process to make the exposed part of the low-dimensional material layer have a good surface for performing a good electrostatic doping after the subsequent deposition of the spacers. When the protective material layer is made of aluminum oxide, phosphoric acid can be used to chemically etch the protective material layer; and when the protective material layer is made of silicon oxide, potassium hydroxide can be used to chemically etch the protective material layer without damaging the lattice structure of the low dimensional material.

The specific composition of the reactive gas is not particularly limited. For example, the reactive gas may include at least one of hydrogen chloride and hydrogen fluoride. Therefore, the reactive gas described above can react with the protective material layer to remove a part of the protective material layer without destroying the lattice structure of the low-dimensional material.

According to an embodiment of the present disclosure, when a protective material layer is provided between the low-dimensional material layer and the base, upper and lower protective material layers are wrapped around the low-dimensional material layer. Therefore, the upper and lower protective material layers can be etched to suspend the exposed low-dimensional material layer as shown in FIG. 11 (*b*) by using a reactive solution or a reactive gas. Therefore, the low-dimensional material layer can be anchored at a predetermined position by remaining parts of the two protective material layers to prevent the low-dimensional material layer from falling off or moving. When the low-dimensional material layer includes a plurality of stacked low-dimensional material sub-layers and a protective material layer is also provided between two adjacent low-dimensional material sub-layers, the protective material layers wraps around the multiple low-dimensional material sub-layers, and the two adjacent low-dimensional material sub-layers can be suspended after the protective material layer is etched.

According to an embodiment of the present disclosure, in this step, after the first grooves are formed and a part of the low-dimensional material layer is exposed to the outside, the exposed part of the low-dimensional material layer may be cleaned by wet cleaning to remove impurities, molecules, polymers and/or other substances adhering to the surface of the low-dimensional material layer. Thus, the cleaned surface of the exposed low-dimensional material layer is a foundation for performing a good electrostatic doping after the subsequent deposition of the spacers.

Figure 7:
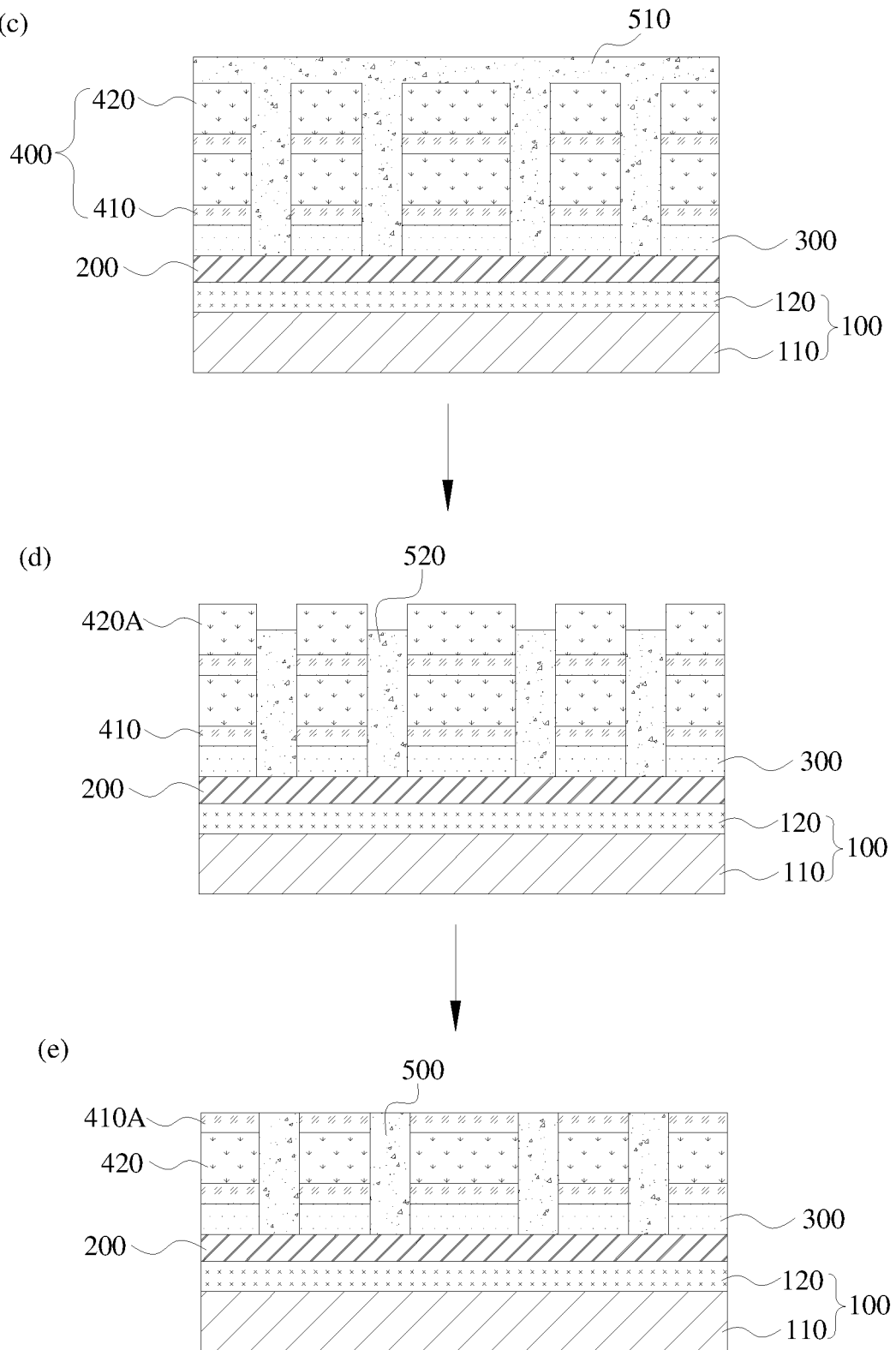
FIG. 7 shows schematic cross-sectional views of structures obtained in a method for forming a transistor according to an embodiment of the present disclosure.
Figure 12:
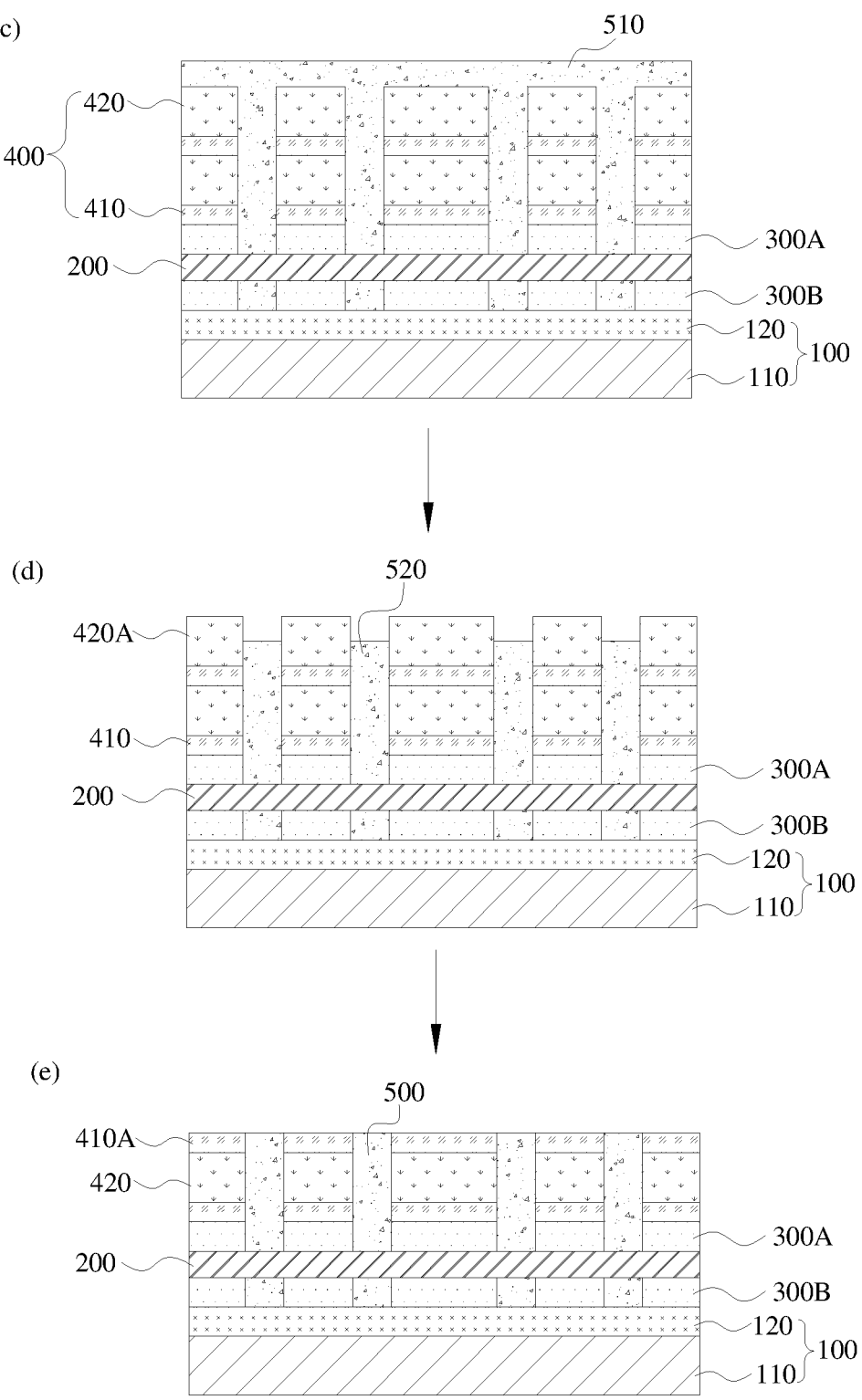
FIG. 12 shows schematic cross-sectional views of structures obtained in a method for forming a transistor according to another embodiment of the present disclosure.

In step 4013, a spacer material layer is grown in the first grooves and a surface of the insulating material layer away from the base. Specifically, first, a spacer material layer 510 is grown in the first grooves and on the insulating material layer, as shown in FIG. 7 (*c*) and FIG. 12 (*c*). According to an embodiment of the present disclosure, the spacer material layer is formed by at least one selected from atomic layer deposition, chemical vapor deposition and physical vapor deposition. Therefore, the first groove with a high aspect ratio can be filled with the material of the spacer material layer well without gaps in the first groove to avoid forming defects in the spacer material layer. It should be noted that when the low-dimensional material layer is suspended (including the case where a protective material layer is provided between the low-dimensional material layer and the base, and the case where the low-dimensional material layer includes a plurality of stacked low-dimensional material sub-layers, in which a protective material layer is provided between two adjacent low-dimensional material sub-layers), the spacer material layer is grown by atomic layer deposition, and the spacer material can be deposited along a surface of the low-dimensional material layer to well fill a suspended region below the low-dimensional material layer with the spacer material layer. When the low-dimensional material layer is directly provided at the surface of the base, at least one of atomic layer deposition, chemical vapor deposition, and physical vapor deposition may be used to grow the spacer material layer, preferably atomic layer deposition. Since the width of the first groove is small, the atomic layer deposition can ensure that the thickness of the spacer material layer deposited on an upper surface of the insulating material layer is not too large after the first groove is completely filled, thus facilitating the subsequent steps, saving materials and reducing costs.

In step 4014, the spacer material layer is patterned to form the spacers. Patterning the spacer material layer may include at least one of reactive ion etching and chemical mechanical polishing. Therefore, a spacer can be formed in the first groove, and the spacer can be used as a self-alignment mask to form the source, the drain and the gate stack in the subsequent steps. The self-alignment mask process can control position relationships between the source and the gate and between the drain and the gate well to reduce the process cost and improve the uniformity of the transistor.

According to the embodiment of the present disclosure, when the low-dimensional material layer is suspended in the first groove, impurities, molecules, polymers and/or other substances on the surface of the low-dimensional material layer can be removed by wet cleaning to obtain a good surface of the exposed low-dimensional material layer. The cleaned surface of the exposed low-dimensional material layer is a foundation for performing a good electrostatic doping after the subsequent deposition of the spacers. After the spacer is provided in the first groove, a part of the spacer is located between the low-dimensional material layer and the base, and another part of the spacer is located on the surface of the low-dimensional material layer away from the base, that is, the spacer is provided around the low-dimensional material layer. The spacer can fix the low-dimensional material layer to avoid defects such as movement of the low-dimensional material layer in the subsequent steps and improve the performance of the transistor.

According to an embodiment of the present disclosure, when the source and the drain are formed in a subsequent step, a photoresist mask needs to be patterned. In order to improve the accuracy of photolithography, in this step, a flat surface can be obtained in advance. The specific process for flattening a surface of a semiconductor structure is not particularly limited. For example, according to some embodiments of the present disclosure, the spacer material layer may be etched until an upper surface of the spacer material layer is located between upper and lower surfaces of the second insulating sub-layer 420A furthest away from the protective material layer 300 to form a spacer blank 520, as shown in FIG. 7 (*d*) and in FIG. 12 (*d*). Subsequently, the second insulating sub-layer 420A and the spacer blank 520 are subjected to chemical mechanical polishing (CMP) to remove the second insulating sub-layer 420A and a part of the spacer blank 520 to form a spacer 500, such that an upper surface of the spacer 500 is flush with an upper surface of the first insulating sub-layer 410A furthest away from the protective material layer 300, in which the first insulating sub-layer 410A is used as a stop layer for chemical mechanical polishing, as shown in FIG. 7 (*e*) and FIG. 12 (*e*).

Alternatively, according to other embodiments of the present disclosure, after forming the spacer blank 520, the second insulating sub-layer 420A is subjected to chemical mechanical polishing to remove a part of the second insulating sub-layer 420A, so that an upper surface of a remaining part of the second insulating sub-layer 420A is flush with an upper surface of the spacer blank 520, that is, the spacer blank 520 finally forms the spacer 500 (not shown). In this embodiment, the spacer blank 520 is used as a stop layer for chemical mechanical polishing.

Alternatively, according to other embodiments of the present disclosure, the spacer material layer 510 is directly subjected to chemical mechanical polishing to remove the spacer material layer located on an upper surface of the second insulating sub-layer 420A to form a spacer 500, such that an upper surface of the spacer 500 is flush with the upper surface of the second insulating sub-layer 420A (not shown). In this embodiment, the second insulating sub-layer 420A is used as a stop layer for chemical mechanical polishing.

According to an embodiment of the present disclosure, the spacer has a fixed charge, and the low-dimensional material layer may be electrostatically doped by the fixed charge in the spacer. Specifically, the spacer may be composed of a material with a fixed charge. Alternatively, a part of the spacer near the low-dimensional material layer is composed of a material with a fixed charge, and another part of the spacer away from the low-dimensional material layer is composed of a low dielectric constant material. Thus, a fixed charge can be introduced into the spacer, and the part of the spacer away from the low-dimensional material layer is composed of a low dielectric constant material, and thus the parasitic capacitance can be further reduced. By using a fixed charge to electrostatically dope the low-dimensional material layer below the spacer, the threshold voltage, on current, off current and switching state of the transistor can be well adjusted without affecting the gate control capability of the gate.

According to other embodiments of the present disclosure, the spacer has a dipole, and the low-dimensional material layer is electrostatically doped by the dipole in the spacer. Specifically, the spacer may be composed of two materials, and a dipole is formed at an interface of the two materials. For example, for a transistor with a suspended low-dimensional material layer, atomic layer deposition is used to deposit the first spacer material and the second spacer material successively such that the spacer material layer wraps around the low-dimensional material layer, and a dipole is formed at an interface of the first spacer material and the second spacer material. Alternatively, for a transistor with the low-dimensional material layer directly provided on the base, dipoles can also be introduced into the spacers, for example, at least one of atomic layer deposition, chemical vapor deposition, and physical vapor deposition is used to deposit a first spacer material and a second spacer material successively, and a dipole is formed at an interface of the first spacer material and the second spacer material. By using a dipole to electrostatically dope the low-dimensional material layer below the spacer, the threshold voltage, on current, off current and switching state of the transistor can be well adjusted without affecting the gate control capability of the gate.

In step 402, a source and a drain are formed on the surface of the low-dimensional material layer away from the base.

Figure 8:
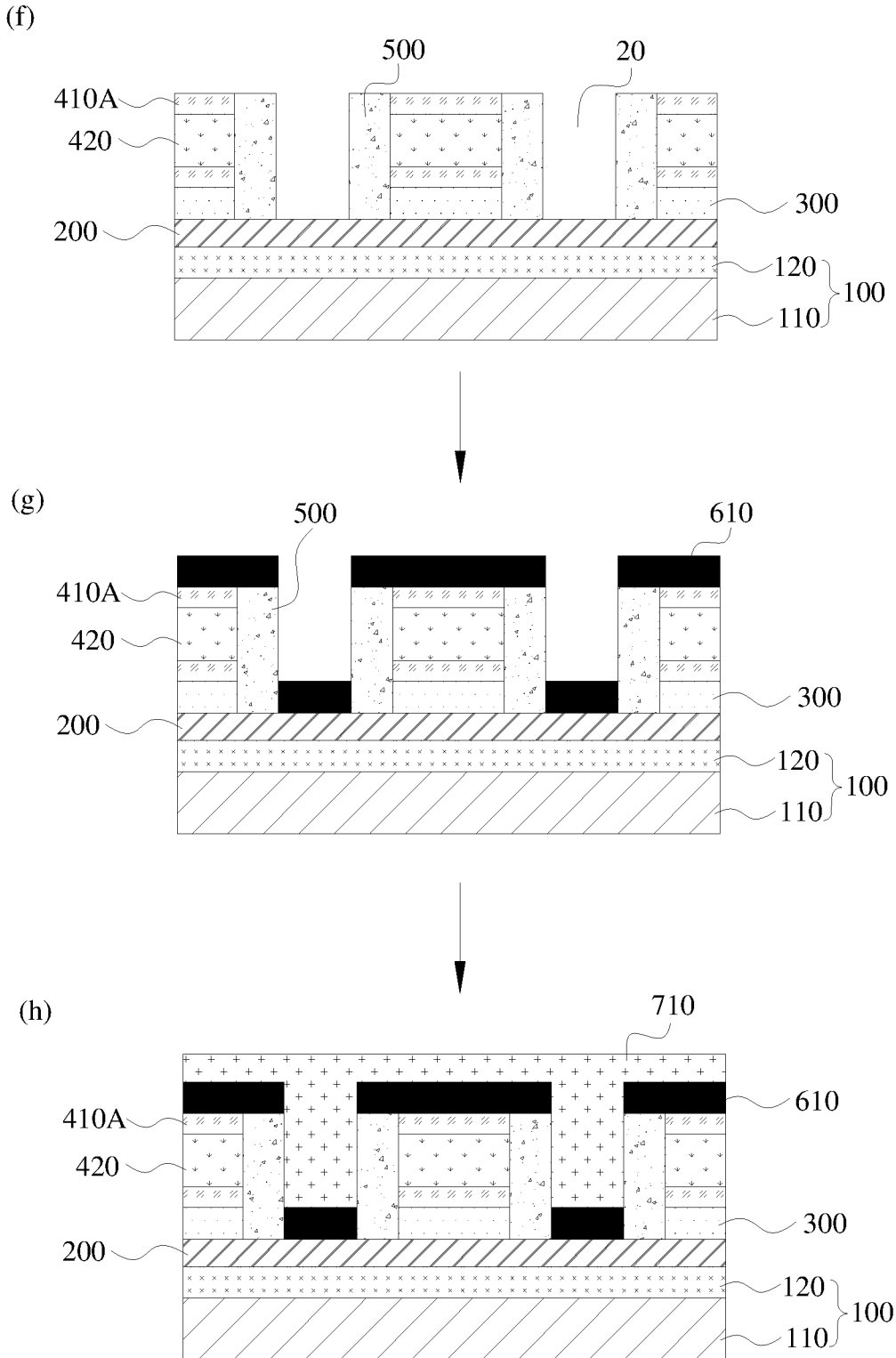
FIG. 8 shows schematic cross-sectional views of structures obtained in a method for forming a transistor according to an embodiment of the present disclosure.
Figure 13:
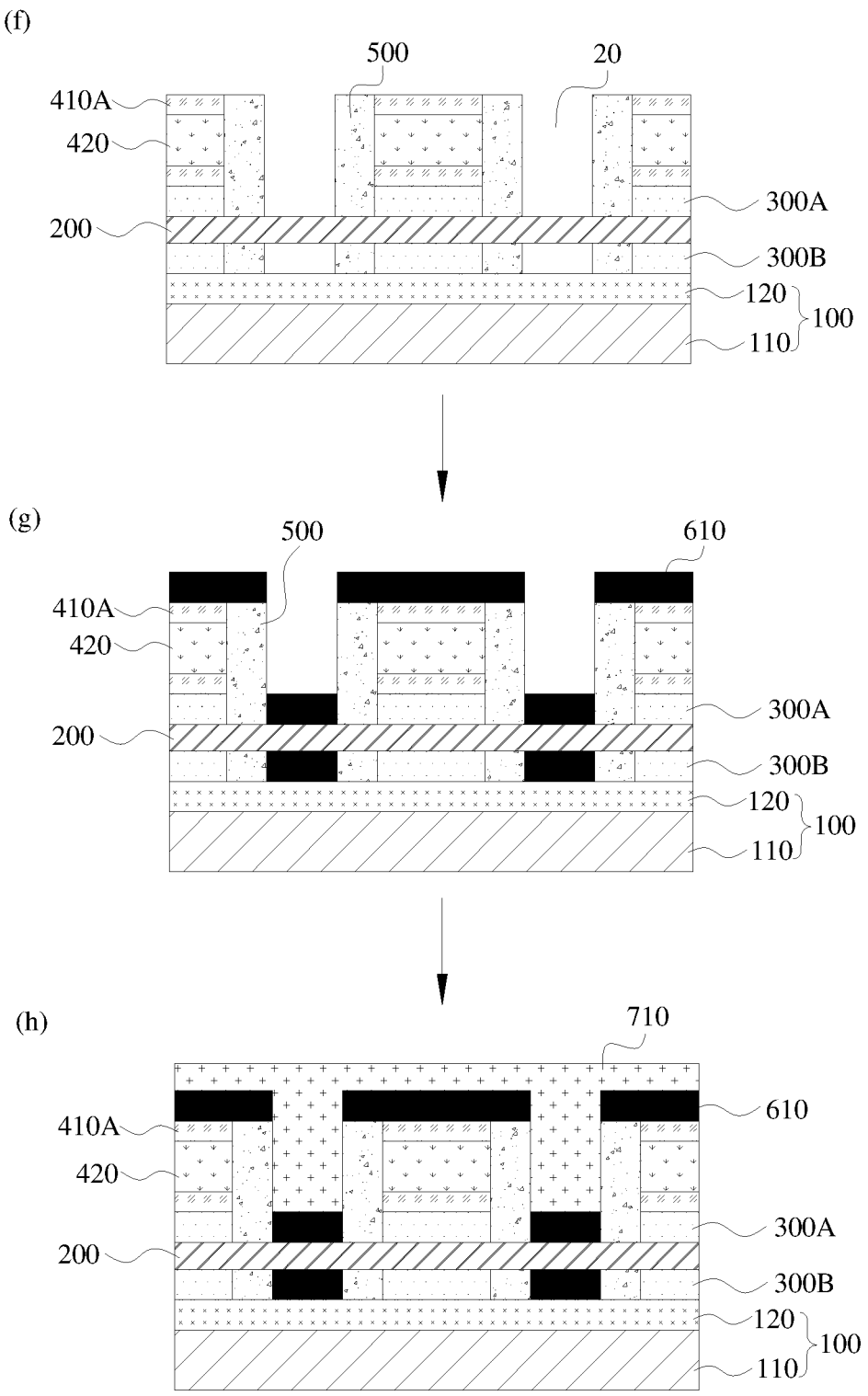
FIG. 13 shows schematic cross-sectional views of structures obtained in a method for forming a transistor according to another embodiment of the present disclosure.

According to an embodiment of the present disclosure, with reference to FIG. 8, FIG. 9, FIG. 13, and FIG. 14, first, the insulating material layer and the protective material layer between two adjacent spacers are patterned sequentially to form second grooves 20, and a part of the low-dimensional material layer 200 is exposed, as shown in FIG. 8 (*f*) and FIG. 13 (*f*). Subsequently, a source and a drain are formed in the second groove 20, respectively, and the source and the drain are separated by the spacer. Therefore, the spacer can be used as a self-alignment mask to form the source and the drain. The self-alignment mask process can control the position, sizes and edge morphology of the source and the drain to reduce the process cost and improve the uniformity of the transistor. In this step, the patterning process of the insulating material layer and the protective material layer is similar to that in step 401, and will not be repeated here. According to an embodiment of the present disclosure, in the finally formed transistor, the gate stack is located between the source and the drain. The gate stack, the source and the drain are separated by the spacers, and are in contact with the spacers, respectively. Therefore, the second groove in this step is formed by patterning parts of the protective material layer and the insulating material layer located in regions where the source and the drain are to be formed, that is, parts of the protective material layer and the insulating material between some spacers are patterned.

According to an embodiment of the present disclosure, forming the source and the drain in the second groove may include steps as follows:

First, a metal material layer 610 is formed in the second grooves and on surfaces of the spacer and the insulating material layer away from the base, as shown in FIG. 8 (*g*) and FIG. 13 (*g*). According to an embodiment of the present disclosure, the metal material layer is formed by physical vapor deposition or atomic layer deposition. Therefore, physical vapor deposition has good collimation and high purity of metal materials, atomic layer deposition can allow materials to grow along a surface where the materials are to be deposited, and the above deposition processes can achieve good deposition of metal materials. When the low-dimensional material layer is suspended, the metal material layer grown by atomic layer deposition is favored, so that the metal material layer can well fill a suspended region below the low-dimensional material layer or a suspended region between two adjacent low-dimensional material layers to form a built-in or wrap-around source and a built-in or wrap-around drain conveniently. When the low-dimensional material layer is suspended, if the low-dimensional material layer is made of a carbon nanotube material and a gap exists between the carbon nanotubes, physical vapor deposition can be used to form a built-in or wrap-around source and a built-in or wrap-around drain.

Subsequently, a dielectric protection material layer 710 is formed on a surface of the metal material layer away from the base, as shown in FIG. 8 (*h*) and in FIG. 13 (*h*). According to an embodiment of the present disclosure, the dielectric protection material layer is formed by at least one selected from atomic layer deposition, chemical vapor deposition and physical vapor deposition, preferably atomic layer deposition. Therefore, the second groove with a high aspect ratio can be filled with the material of the dielectric protection material layer well without gaps in the second groove to avoid forming defects in the dielectric protection material layer. The atomic layer deposition can ensure that the thickness of the dielectric protection material layer deposited on the upper surface of the metal material layer is not too thick after a remaining part of the second groove is completely filled, thus facilitating the subsequent steps, saving materials and reducing costs.

Figure 9:
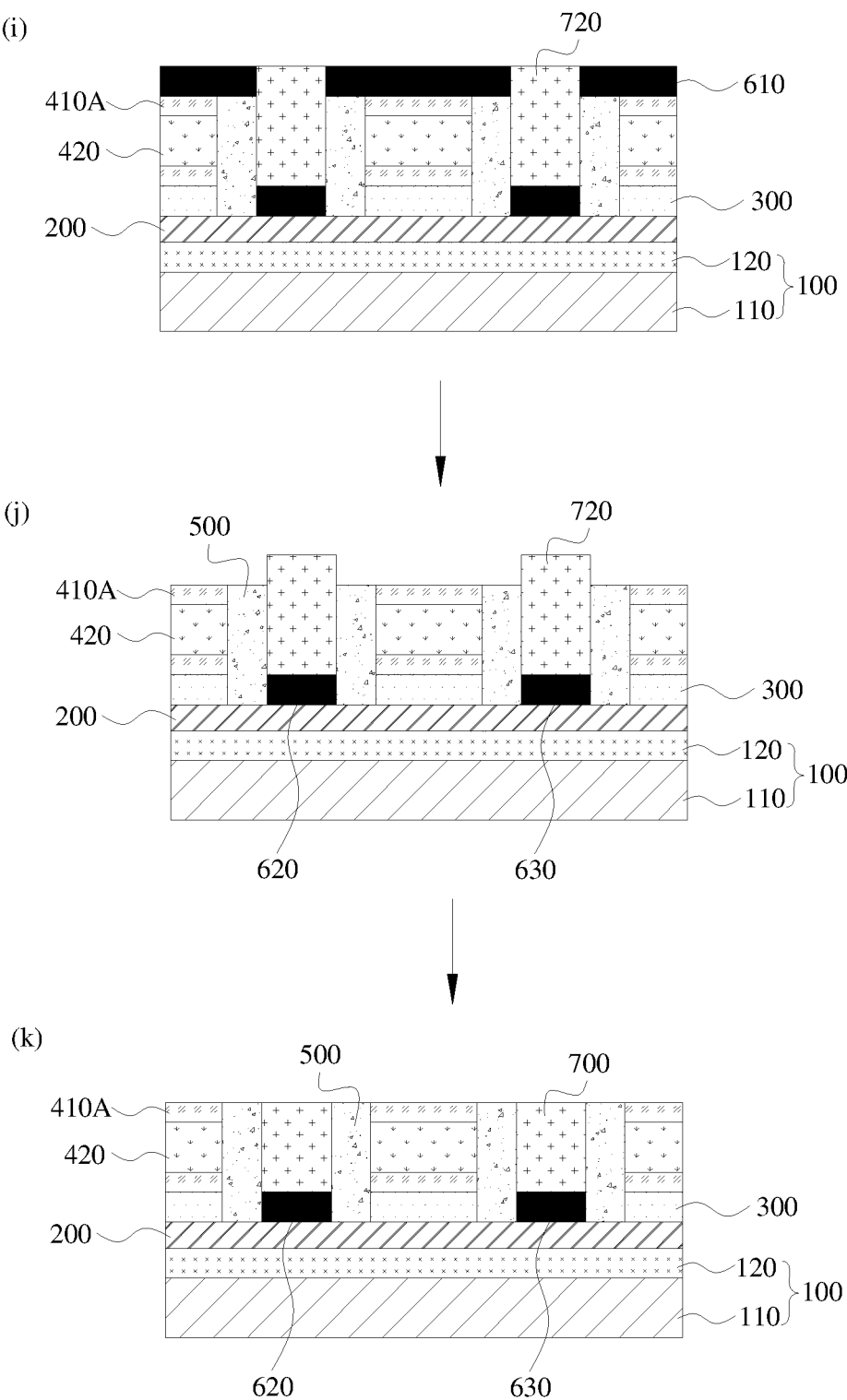
FIG. 9 shows schematic cross-sectional views of structures obtained in a method for forming a transistor according to an embodiment of the present disclosure.

Subsequently, the dielectric protection material layer is patterned to selectively remove a part of the dielectric material layer to form a dielectric protection layer to expose the metal material layer on the surfaces of the spacer and the insulating material layer away from the base, as shown in FIG. 9 (*i*) and FIG. 14 (*i*).

Figure 14:
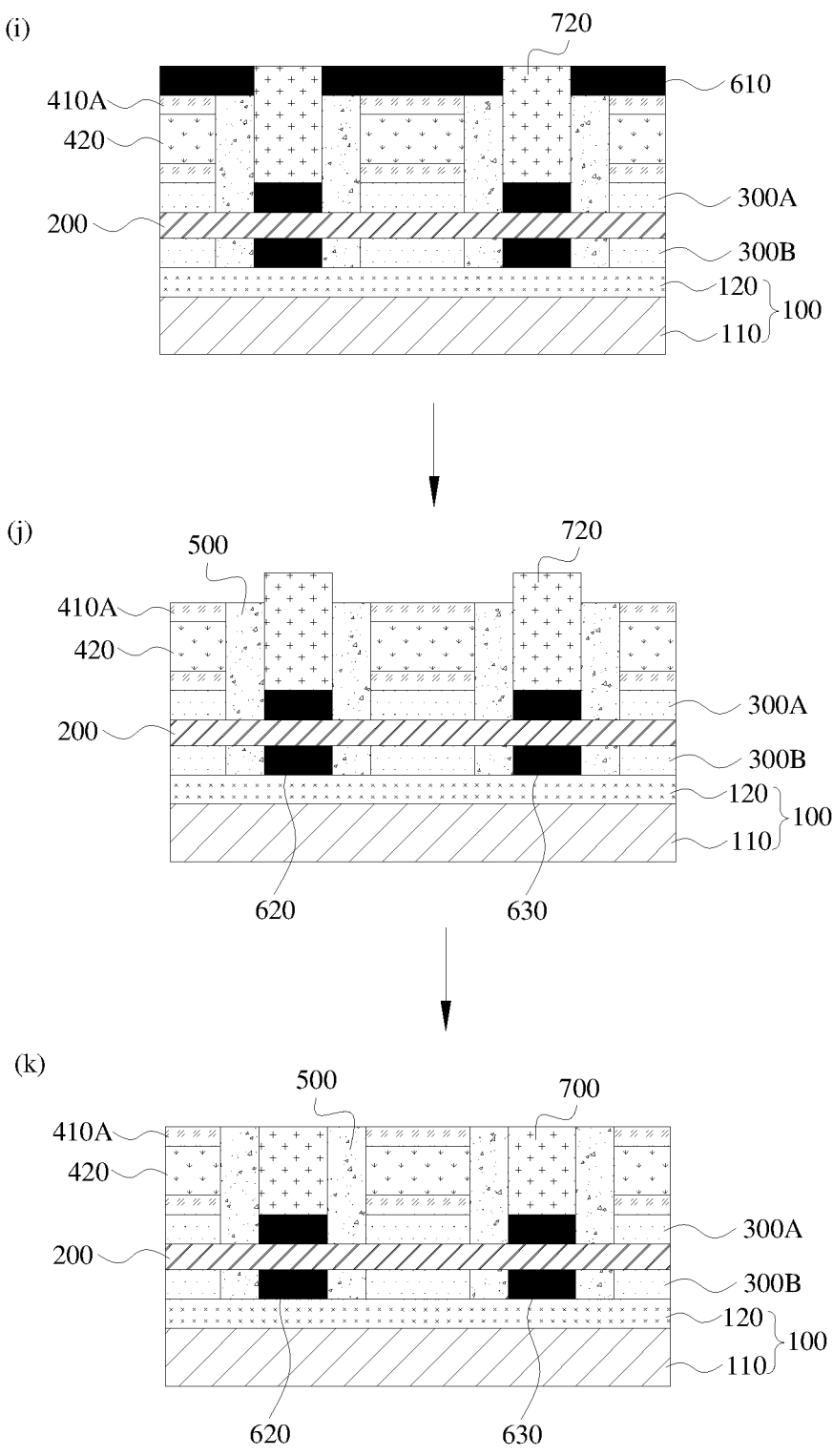
FIG. 14 shows schematic cross-sectional views of structures obtained in a method for forming a transistor according to another embodiment of the present disclosure.

Finally, with reference to in FIG. 9 (*j*) and FIG. 14 (*j*), the metal material layer on the surfaces of the spacer and the insulating material layer away from the base is removed to obtain the source and the drain in contact with the spacers, respectively. According to an embodiment of the present disclosure, the metal material layer on the surfaces of the spacer and the insulating material layer away from the base may be removed by reactive ion etching or wet etching, preferably, wet etching. During the process of etching the metal material layer on the spacer and the insulating material layer, the source and drain metals and the low-dimensional material layer in a source-drain region and metals in an etched region are well separated by an dielectric protection layer blank 720 to prevent the etching process from influencing and damaging the source and the drain and the low-dimensional material layer.

According to an embodiment of the present disclosure, when a gate dielectric layer is formed in a subsequent step, a photoresist mask needs to be patterned. In order to improve the accuracy of photolithography, in this step, a flat surface can be obtained in advance. The specific process for flattening a surface of a semiconductor structure is not particularly limited. For example, the dielectric protection material layer is patterned to selectively remove a part of the dielectric material layer, such that a dielectric protection layer blank 720 is formed and the metal material layer located on the surfaces of the spacer and the insulating material layer away from the base is exposed, as shown in FIG. 9 (*i*) and FIG. 14 (*i*). The dielectric protection material layer may be patterned by etching or chemical mechanical polishing. The etching can include reactive ion etching. Subsequently, the dielectric protection layer blank 720 is patterned, and a part of the dielectric protection layer blank 720 is selectively removed to form the dielectric protection layer 700, such that a surface of the dielectric protection layer 700 away from the base is flush with a surface of the spacer away from the base, as shown in FIG. 9 (*k*) and FIG. 14 (*k*). According to an embodiment of the present disclosure, the dielectric protection layer blank 720 may be patterned by chemical mechanical polishing, or by a combination of etching and chemical mechanical polishing to obtain a semiconductor structure with a flat surface.

The specific material for the metal material layer is not particularly limited, and can be designed by the skilled person in the art according to materials commonly used in sources and drains of transistors, such as palladium and scandium.

According to an embodiment of the present disclosure, in this step, after the second groove is formed and a part of the low-dimensional material layer is exposed to the outside, the exposed part of the low-dimensional material layer may be cleaned by wet cleaning to remove impurities, molecules, polymers and/or other substances adhering on the surface of the low-dimensional material layer, such that the exposed part of the low-dimensional material layer may have a good surface to improve the performance of the low-dimensional material layer, especially, the contact quality of the sources and drains.

When the low-dimensional material layer is suspended in the second groove, the low-dimensional material layer is fixed by spacers on both sides of the second groove, and the completely exposed surface of the low-dimensional material layer can be cleaned more effectively to remove impurities, molecules, polymers and/or other substances adhering on the surface of the low-dimensional material layer, such that the exposed part of the low-dimensional material layer may have a good surface to improve the performance of the low-dimensional material layer, especially, the contact quality of the sources and drains.

In step 403, a gate stack is formed on the surface of the low-dimensional material layer away from the base and between the source and the drain to obtain a transistor.

In this step, a gate stack (i.e. a gate) is formed to obtain a transistor.

Figure 15:
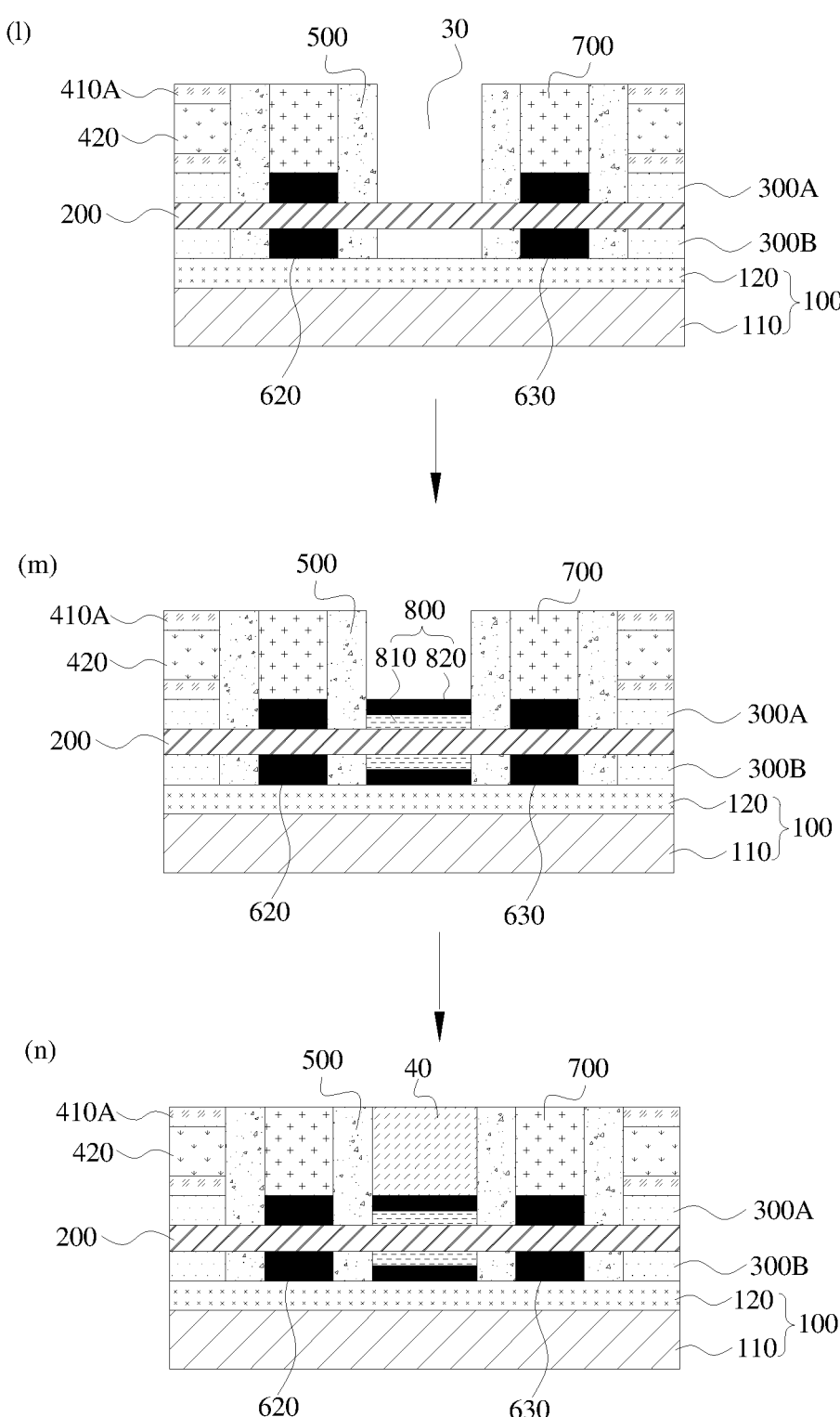
FIG. 15 shows schematic cross-sectional views of structures obtained in a method for forming a transistor according to another embodiment of the present disclosure.

According to an embodiment of the present disclosure, with reference to FIG. 10 and FIG. 15, first, the insulating material layer and the protective material layer between two spacers between the source and the drain are patterned in sequence to form a third groove 30 to expose a part of the low-dimensional material layer 200, as shown in FIG. 10 (1) and FIG. 15 (1), and then a gate stack is formed in the third groove 30. Therefore, the spacer can be used as a self-aligning mask for forming the gate to control the position, size and edge morphology of the gate to reduce the process cost and improve the uniformity of the transistor. In this step, the patterning process of the insulating material layer and the protective material layer is similar to that in step 401, and will not be repeated here.

According to an embodiment of the present disclosure, a gate dielectric layer 810 and a gate metal layer 820 are sequentially formed in the third groove 30 to form a gate stack in contact with the spacer, as shown in FIG. 10 (*m*) and FIG. 15 (*m*). When the low-dimensional material layer is suspended in the third groove, as shown in FIG. 15 (*m*) and FIG. 3, a gate-all-around structure where the gate dielectric layer surrounds the low-dimensional material layer and the gate metal layer surrounds the gate dielectric layer may be formed, to further improve the gate control and achieve better electrostatics for the transistor.

According to an embodiment of the present disclosure, the gate dielectric layer and the gate metal layer may be formed by the following steps: first, a gate dielectric material layer and a gate metal material layer are deposited in sequence, and then the gate dielectric material layer and the gate metal material layer on surfaces of the insulating material layer and the dielectric protection layer away from the base are selectively removed by reactive ion etching or chemical mechanical polishing, preferably chemical mechanical polishing, to form the gate dielectric layer and the gate metal layer. In this case, the gate dielectric material layer and the metal material layer may be formed by atomic layer deposition, physical vapor deposition or chemical vapor deposition. When the low-dimensional material layer is suspended, preferably, the gate dielectric layer and the gate metal layer are formed by atomic layer deposition to form a warp-around gate.

According to an embodiment of the present disclosure, each of the gate dielectric layer and the gate metal layer may be a single layer or a multilayered structure. The materials for the gate dielectric layer and the gate metal layer are not particularly limited, and can be designed by the skilled person in the art according to materials commonly used in gate dielectric layers and gate metal layers in transistors.

According to an embodiment of the present disclosure, as shown in FIG. 10 (*n*) and FIG. 15 (*n*), this step further includes forming a gate interconnect metal layer 40 located on the gate metal layer in the third groove to connect the gate to an external circuit.

According to an embodiment of the present disclosure, in this step, after the third groove is formed and a part of the low-dimensional material layer is exposed to the outside, the exposed part of the low-dimensional material layer may be cleaned by wet cleaning to remove impurities, molecules, polymers and/or other substances adhering on the surface of the low-dimensional material layer, such that the exposed part of the low-dimensional material layer may have a good surface to improve the performance of the low-dimensional material layer, especially, the quality of the interface between the low-dimensional material and the gate dielectric material.

When the low-dimensional material layer is suspended in the third groove, the low-dimensional material layer is fixed by spacers on both sides of the third groove, and the completely exposed surface of the low-dimensional material layer can be cleaned more effectively to remove impurities, molecules, polymers and/or other substances adhering on the surface of the low-dimensional material layer, such that the exposed part of the low-dimensional material layer may have a good surface to improve the performance of the low-dimensional material layer, especially, the quality of the interface between the low-dimensional material and the gate dielectric material.

It should be noted that FIG. 1 to FIG. 3 and FIG. 6 to FIG. 15 are schematic cross-sectional views taken at a position where the low-dimensional material layer is located, and only show the positional relationships between the low-dimensional material layer and other layers on the above-mentioned cross sections.

In summary, this method for fabricating the transistor according to embodiments of the present disclosure has at least one of advantages as follows:

(1) This method can well control the position relationships between the source and the gate and between the drain and the gate, reduce the process cost and improve the performance of the transistor.

(2) This method can well control the size and edge morphology of the source, the drain and the gate, and improve the uniformity of the transistor.

(3) In the process of forming the spacer, the low-dimensional material layer can be fixed by the protective material layer to avoid the movement, shedding or deformation of the low-dimensional material layer and further improve the uniformity of the transistor and the process stability.

(4) In the process of forming the source, the drain and the gate, the low-dimensional material layer can be fixed by the spacer to avoid the movement, shedding or deformation of the low-dimensional material layer and further improve the uniformity of the transistor and the process stability.

(5) Since the low-dimensional material layer is suspended, it is possible to form the gate-all-around structure to improve the gate control and achieve better electrostatics, while avoiding the interface interaction between the low-dimensional material layer and the base and between the gate dielectric layer and the base.

(6) Since the low-dimensional material layer is suspended, the low-dimensional material layer may be cleaned by wet cleaning to remove impurities, molecules, polymers and/or other substances adhering on the surface of the low-dimensional material layer to improve the performance of the low-dimensional material layer.

(7) Since the low-dimensional material layer is suspended, it is possible to obtain a wrap-around source and a wrap-around drain, such that the source and drain metal materials are in contact with the low-dimensional material layer more effectively to further improve contact quality, reduce source-drain contact resistance and increase the contact heat stability.

(8) Since the protective material layer is composed of at least one of yttrium oxide, lanthanum oxide, scandium oxide, silicon oxide, aluminum oxide and other materials, the protective material layer can be etched using the reactive solution or the reactive gas without damage to the low-dimensional material layer, and adsorbates and ionic impurities on the surface of the low-dimensional material layer can also be removed to improve the interface characteristics between the low-dimensional material layer and other layers, and improve the performance of the transistor.

(9) In the process of forming the source and the drain, a dielectric protection material layer is formed on the metal material layer. When the excess metal material is etched, the dielectric protection material layer can isolate the metal materials of the source and drain regions from the etched region to prevent the source, the drain and the low-dimensional material layer from being damaged by the etching process.

(10) By introducing a fixed charge or dipole into the spacer and using the fixed charge or dipole to electrostatically dope the low-dimensional material layer below the spacer, it is possible to reduce the difference caused by the different properties of the low-dimensional material and adjust the threshold voltage, on current, off current voltage and switching state of the transistor without affecting the gate control and electrostatic control of the gate region over the low-dimensional material layer, so that the transistor can simultaneously have multiple key indicators (such as on state, off state, threshold voltage, gate control, reliability, etc.).

In the specification, the terms "upper", "lower", etc. should be construed to refer to the orientation as then described or as shown in the drawings under discussion. These relative terms are for convenience of description and do not require that the present disclosure be constructed or operated in a particular orientation.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples. Although explanatory embodiments have been shown and described, it would be appreciated by those skilled in the art that changes, alternatives, and modifications may be made in the embodiments without departing from spirit and principles of the disclosure. In addition, it should be noted that terms such as "first" and "second" are used herein for purposes of description and are not intended to indicate or imply relative importance or significance.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for fabricating a transistor, comprising:
forming a low-dimensional material layer above a base,
forming spacers on a surface of the low-dimensional material layer away from the base, the spacers being spaced apart from each other;
forming a source and a drain on the surface of the low-dimensional material layer away from the base;
forming a gate stack on the surface of the low-dimensional material layer away from the base and between the source and the drain,
wherein the gate stack, the source and the drain are separated by the spacers, and in contact with the spacers, respectively;

wherein forming the spacers comprises:
depositing a protective material layer and an insulating material layer in sequence on the surface of the low-dimensional material layer away from the base;
patterning the insulating material layer and the protective material layer in sequence to form a plurality of spaced first grooves to expose a first part of the low-dimensional material layer;
growing a spacer material layer in the plurality of first grooves and on a surface of the insulating material layer away from the base; and
patterning the spacer material layer to form the spacers, wherein:
growing the spacer material layer is performed by at least one selected from atomic layer deposition, chemical vapor deposition and physical vapor deposition; and/or
patterning the spacer material layer is performed by at least one selected from reactive ion etching and chemical mechanical polishing.

2. The method according to claim 1, wherein the insulating material layer comprises a plurality of stacked insulating sub-layers with a thickness of 100 to 3000 nm, wherein a deposition temperature of the insulating material layer is lower than 400° C., and/or a deposition temperature of the protective material layer is lower than 400° C.

3. The method according to claim 1, wherein patterning the protective material layer comprises chemically etching the protective material layer with a reactive solution or a reactive gas, and washing the etched protective material layer with water, wherein:
the reactive solution comprises an acidic solution or an alkaline solution;
the acidic solution comprises at least one selected from hydrochloric acid, acetic acid, nitric acid, phosphoric acid and sulphuric acid;
the alkaline solution comprises at least one selected from potassium hydroxide, sodium hydroxide and tetramethylammonium hydroxide;
the reactive gas comprises at least one selected from hydrogen chloride and hydrogen fluoride;
a material for the protective material layer comprises at least one selected from yttrium oxide, lanthanum oxide, scandium oxide, silicon oxide, and aluminum oxide; and/or
a thickness of the protective material layer is 3 to 50 nm.

4. The method according to claim 1, further comprising:
before depositing the protective material layer on the surface of the low-dimensional material layer away from the base, forming another protective material layer between the base and the low-dimensional material layer.

5. The method according to claim 1, wherein forming the source and the drain comprises:
patterning the insulating material layer and the protective material layer between two adjacent spacers in sequence to form a plurality of second grooves to expose a second part of the low-dimensional material layer;
forming in the plurality of second grooves the source and the drain separated by the spacers.

6. The method according to claim 5, wherein forming the source and the drain in the plurality of second grooves comprises:
forming a metal material layer in the plurality of second grooves and on surfaces of the spacers and the insulating material layer away from the base;

US 12,575,247 B2

25 forming a dielectric protection material layer on a surface of the metal material layer away from the base;

patterning the dielectric protection material layer to expose the metal material layer on the surfaces of the spacers and the insulating material layer away from the base; and removing the metal material layer on the surfaces of the spacers and the insulating material layer away from the base to obtain the source and the drain, wherein:

forming the metal material layer is performed by physical vapor deposition or atomic layer deposition;

forming the dielectric protection material layer is performed by at least one of atomic layer deposition, chemical vapor deposition, and physical vapor deposition; and/or patterning the dielectric protection material layer is performed by at least one selected from reactive ion etching and chemical mechanical polishing.

7. The method according to claim 5, wherein forming the gate stack comprises:

patterning the insulating material layer and the protective material layer between two spacers between the source and the drain in sequence to form a third groove to expose a third part of the low-dimensional material layer; and forming the gate stack in the third groove, wherein:

a gate dielectric layer and a gate metal layer are sequentially formed in the third groove to form the gate stack; and the gate dielectric layer and the gate metal layer are formed by at least one of atomic layer deposition, chemical vapor deposition and physical vapor deposition.

8. The method according to claim 7, further comprising:

cleaning the exposed first part, the exposed second part and the exposed third part of the low dimensional material layer by wet cleaning after forming the plurality of first grooves, the second grooves and the third grooves, respectively.

9. The method according to claim 1, wherein the low-dimensional material layer comprises a plurality of low-dimensional material sub-layers, wherein the protective material layer is located between two adjacent low-dimensional material sub-layers.

* * * * *